(12) United States Patent
Baek et al.

(10) Patent No.: US 12,010,846 B2
(45) Date of Patent: Jun. 11, 2024

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Sungkweon Baek, Hwaseong-si (KR); Hakseon Kim, Seoul (KR); Jaehwa Seo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 17/476,711

(22) Filed: Sep. 16, 2021

(65) Prior Publication Data
US 2022/0208787 A1    Jun. 30, 2022

(30) Foreign Application Priority Data
Dec. 28, 2020  (KR) .................. 10-2020-0185216

(51) Int. Cl.
*H10B 43/27*   (2023.01)
*H10B 41/27*   (2023.01)
(Continued)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 41/27; H10B 41/41; H10B 43/40; H10B 43/50; H10B 43/20; H10B 43/30; H01L 29/0692–0696; H01L 29/0843–0847; H01L 29/7833; H01L 29/78618

See application file for complete search history.

(56) References Cited

U.S. PATENT DOCUMENTS 6,974,998 B1   12/2005   Du et al.
8,587,056 B2   11/2013   Lee et al.
(Continued)

FOREIGN PATENT DOCUMENTS

KR   10-2000-0002905   1/2000
KR   10-0917819        9/2009

*Primary Examiner* — Wasiul Haider
(74) *Attorney, Agent, or Firm* — F. CHAU & ASSOCIATES, LLC

(57) ABSTRACT

A transistor of a semiconductor device includes an isolation region, an active region disposed in the isolation region, a gate extending in a second direction on the active region, and source and drain regions respectively extending in a first direction perpendicular to the second direction in the active region on first and second sides of the gate. The source and drain regions include low-concentration source and drain doping regions including first and second low-concentration source and drain doping regions The source and drain regions further include high-concentration source and drain doping regions respectively disposed in the low-concentration source and drain doping regions and having higher doping concentrations than the low-concentration source and drain doping regions. A first length in the second direction of the first low-concentration source and drain doping regions is greater than a second length in the second direction of the second low-concentration source and drain doping regions.

20 Claims, 23 Drawing Sheets

(51) Int. Cl.
    *H10B 41/41*     (2023.01)
    *H10B 43/40*     (2023.01)

(56) References Cited

U.S. PATENT DOCUMENTS

| | | |
|---|---|---|
| 9,368,623 B2 | 6/2016 | Xue et al. |
| 9,386,203 B2 | 7/2016 | Lue |
| 9,755,072 B2 | 9/2017 | Xue et al. |
| 2012/0168862 A1* | 7/2012 | Lee .................... H01L 29/0847 |
| | | 257/E29.256 |

* cited by examiner

SEMICONDUCTOR DEVICE AND ELECTRONIC SYSTEM INCLUDING THE SAME

CROSS-REFERENCE TO RELATED APPLICATIONS

This patent application claims priority under 35 U.S.C. § 119 to Korean Patent Application No. 10-2020-0185216, filed on Dec. 28, 2020 in the Korean Intellectual Property Office, the disclosure of which is incorporated by reference herein in its entirety.

TECHNICAL FIELD

The present disclosure relates to semiconductors and, more particularly, to a semiconductor device and an electronic system including the semiconductor device.

DISCUSSION OF RELATED ART

A semiconductor device is an electronic device including a semiconductor material such as silicon, germanium, gallium arsenide, and the like, which may be used for storing data. A semiconductor device capable of storing a large amount of data in an electronic system requiring data storage, such as a flash memory device, has been proposed. A flash memory device may include a transistor, such as a high voltage transistor. A high voltage transistor may refer to a transistor having a high breakdown voltage.

SUMMARY

Embodiments of the inventive concept provide a semiconductor device which may suppress a decrease in breakdown voltage and may promote an increased current, and an electronic system including the same.

According to an embodiment of the inventive concept, a semiconductor device includes a substrate, a peripheral circuit including a plurality of transistors disposed on the substrate, and a memory cell array controlled by the peripheral circuit. Each of the plurality of transistors includes an isolation region disposed on the substrate, an active region disposed in the isolation region, a gate extending in a second direction on the active region, and source and drain regions respectively extending in a first direction perpendicular to the second direction in the active region on first and second sides of the gate. The source and drain regions include low-concentration source and drain doping regions including first low-concentration source and drain doping regions disposed in a gate-adjacent region adjacent to the gate and second low-concentration source and drain doping regions disposed in a gate-distant region separated from the gate by the gate-adjacent region. The source and drain regions further include high-concentration source and drain doping regions respectively disposed in the low-concentration source and drain doping regions and having higher doping concentrations than the low-concentration source and drain doping regions. A first length in the second direction of the first low-concentration source and drain doping regions is greater than a second length in the second direction of the second low-concentration source and drain doping regions.

According to an embodiment of the inventive concept, a semiconductor device includes a peripheral circuit including a plurality of transistors. Each of the plurality of transistors includes a gate extending in a second direction on an active region defined by an isolation region and source and drain regions respectively extending in a first direction perpendicular to the second direction in the active region on first and second sides of the gate in the first direction. The source and drain regions include low-concentration source and drain doping regions including first low-concentration source and drain doping regions disposed in a gate-adjacent region adjacent to the gate and second low-concentration source and drain doping regions located in a gate-distant region separated from the gate by the gate-adjacent region. The source and drain regions further include high-concentration source and drain doping regions having higher doping concentrations than the low-concentration source and drain doping regions. A first length in the second direction of the first low-concentration source and drain doping regions is greater than a second length in the second direction of the second low-concentration source and drain doping regions.

According to an embodiment of the inventive concept, an electronic system includes a main substrate, a semiconductor device disposed on the main substrate, and a controller electrically connected to the semiconductor device. The semiconductor device includes a peripheral circuit including a plurality of transistors. Each of the plurality of transistors includes a gate extending in a second direction on an active region defined by an isolation region and source and drain regions respectively extending in a first direction perpendicular to the second direction in the active region on first and second sides of the gate. The source and drain regions include low-concentration source and drain doping regions including first low-concentration source and drain doping regions disposed in a gate-adjacent region adjacent to the gate and second low-concentration source and drain doping regions disposed in a gate-distant region separated from the gate by the gate-adjacent region. The source and drain regions further include high-concentration source and drain doping regions having higher doping concentrations than the low-concentration source and drain doping regions. A first length in the second direction of the first low-concentration source and drain doping regions is greater than a second length in the second direction of the second low-concentration source and drain doping regions.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
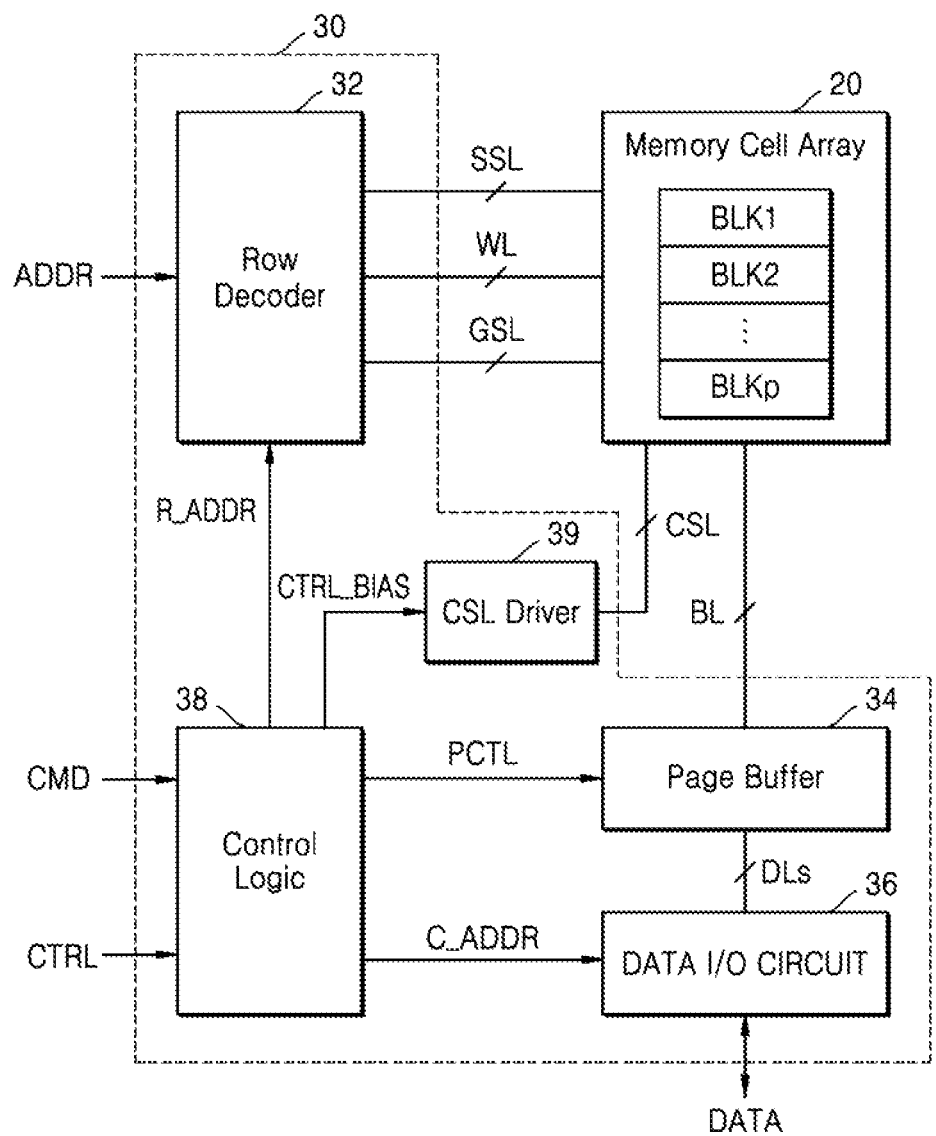
FIG. 1 is a block diagram of a semiconductor device according to an embodiment of the inventive concept.

Embodiments of the inventive concept will be described more fully hereinafter with reference to the accompanying drawings. Like reference numerals may refer to like elements throughout the accompanying drawings. The following embodiments of the inventive concept may be implemented by only one embodiment, or the following embodiments may be implemented by combining one or more embodiments. Therefore, the inventive concept is not to be construed as being limited to one embodiment.

As used herein, the singular forms "a," "an," and "the" are intended to include the plural forms as well, unless the context clearly indicates otherwise.

FIG. 1 is a block diagram of a semiconductor device 10 according to an embodiment of the inventive concept.

Referring to FIG. 1, the semiconductor device 10 may include a memory cell array 20 and a peripheral circuit 30. The memory cell array 20 may be controlled by the peripheral circuit 30. The memory cell array 20 may include a plurality of memory cell blocks BLK1 to BLKp. Each of the plurality of memory cell blocks BLK1 to BLKp may include a plurality of memory cells. The plurality of memory cell blocks BLK1 to BLKp may be connected to the peripheral circuit 30 through a plurality of bit lines BL, a plurality of word lines WL, at least one string selection line SSL, and at least one ground selection line GSL.

The peripheral circuit 30 may include a row decoder 32, a page buffer 34, a data input/output (I/O) circuit 36, a control logic 38, and a common source line driver 39. The peripheral circuit 30 may further include various circuits such as a voltage generating circuit for generating various voltages needed for an operation of the semiconductor device 10, an error correction circuit for correcting an error of data read from the memory cell array 20, and an I/O interface.

In some embodiments, each of the components constituting the peripheral circuit 30 may include a plurality of transistors, such as metal oxide silicon (MOS) transistors. In some embodiments, each of the components constituting the peripheral circuit 30 may include a plurality of transistors, such as high voltage transistors.

In some embodiments, a high voltage transistor may be a transistor having a breakdown voltage of about 5 volts (V) to about 10 V. In some embodiments, a high voltage transistor may be a transistor having a breakdown voltage of 10 V or higher. In some embodiments, a high voltage transistor may be a transistor having a breakdown voltage of about 10 V to about 30 V.

The memory cell array 20 may be connected to the row decoder 32 through the plurality of word lines WL, the plurality of string selection lines SSL, and the plurality of ground selection lines GSL, and may be connected to the page buffer 34 through the plurality of bit lines BL. In the memory cell array 20, each of the plurality of memory cells included in each of the plurality of memory cell blocks BLK1 to BLKp may be a flash memory cell. The memory cell array 20 may include a three-dimensional (3D) memory cell array. The 3D memory cell array may include a plurality of NAND strings, and each of the plurality of NAND strings may include a plurality of vertically stacked memory cells respectively connected to the plurality of word lines WLs.

The peripheral circuit 30 may receive an address ADDR, a command CMD, and a control signal CTRL from outside of the semiconductor device 10 and may transmit and receive data DATA to and from a device outside the semiconductor device 10. The row decoder 32 may select at least one memory cell block from among the plurality of memory cell blocks BLK1 to BLKp in response to the address ADDR from the outside and may select a word line WL, a string selection line SSL, and a ground selection line GSL connected to the selected memory cell block. The row decoder 32 may transfer a voltage for performing a memory operation to the word line WL connected to the selected memory cell block.

The page buffer 34 may be connected to the memory cell array 20 through the plurality of bit lines BL. In performing a program operation, the page buffer 34 may operate as a write driver by applying a voltage, based on data DATA stored in the memory cell array 20, to the bit line BL. In performing a read operation, the page buffer 34 may operate as a sensing amplifier by sensing the data DATA stored in the memory cell array 20. The page buffer 34 may operate based on a control signal PCTL provided from the control logic 38.

The data I/O circuit 36 may be connected to the page buffer 34 through a plurality of data lines DL. In performing a program operation, the data I/O circuit 36 may receive the data DATA from a memory controller and may provide program data DATA to the page buffer 34 based on a column address C_ADDR provided from the control logic 38. In performing a read operation, the data I/O circuit 36 may provide the memory controller with read data DATA stored in the page buffer 34 based on the column address C_ADDR.

The data I/O circuit 36 may transfer an address or a command, which is input thereto, to the control logic 38 or the row decoder 32. The peripheral circuit 30 may further include an electrostatic discharge (ESD) circuit and a pull-up/pull-down driver.

The control logic 38 may receive the command CMD and the control signal CTRL from the memory controller. The control logic 38 may provide a row address RADDR to the row decoder 32 and may provide the column address C_ADDR to the data I/O circuit 36. The control logic 38 may generate various internal control signals which are used in the semiconductor device 10 in response to the control signal CTRL. For example, the control logic 38 may control a voltage level provided to a word line WL and a bit line BL in performing a memory operation such as a program operation or an erase operation.

The common source line driver 39 may be connected to the memory cell array 20 through a plurality of common source lines CSL. The common source line driver 39 may apply a common source voltage (e.g., a power supply voltage) or a ground voltage to a common source line CSL based on a bias signal CTRL_BIAS of the control logic 38.

Figure 2:
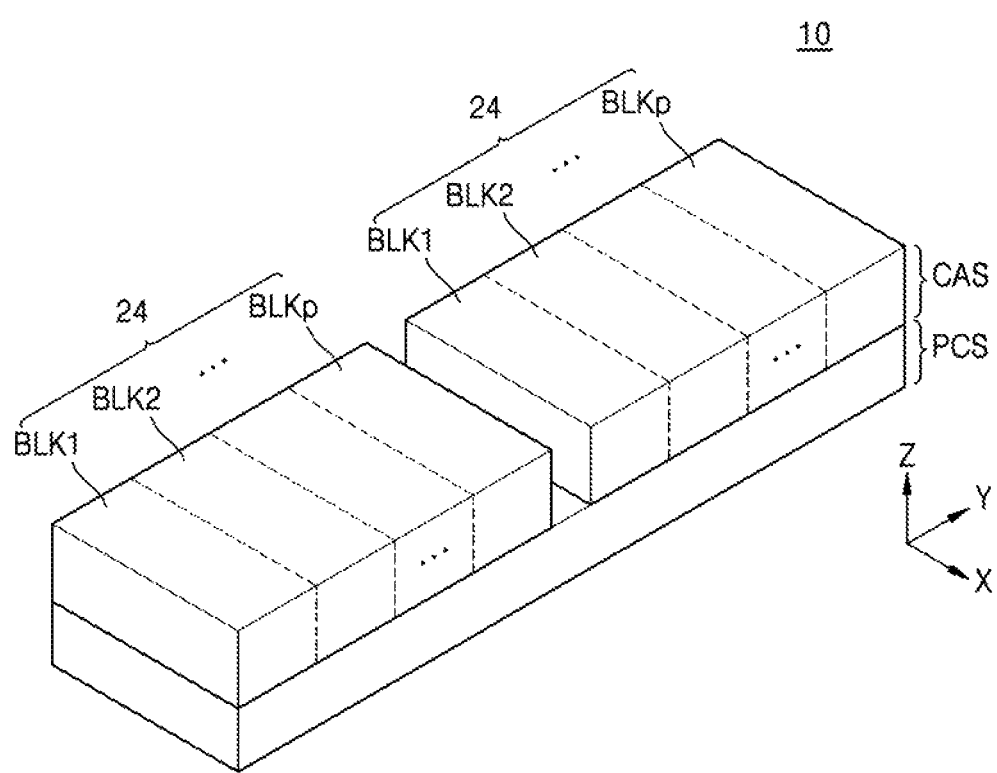
FIG. 2 is a schematic perspective view of a semiconductor device according to an embodiment of the inventive concept.

FIG. 2 is a schematic perspective view of a semiconductor device 10 according to an embodiment of the inventive concept.

Referring to FIG. 2, the semiconductor device 10 may include a cell array structure CAS and a peripheral circuit structure PCS, which may be arranged in a third direction (a Z direction) which is a vertical direction. A first direction (an X direction) is a horizontal direction, and a second direction (a Y direction) is a horizontal direction which may be perpendicular to the first direction. The third direction may be perpendicular to the first and second directions. The cell array structure CAS may include the memory cell array 20 of FIG. 1.

In some embodiments, the peripheral circuit structure PCS may include a plurality of transistors such as MOS transistors. In some embodiments, the peripheral circuit structure PCS may include a plurality of transistors such as high voltage transistors. In some embodiments, a high voltage transistor may be a transistor having a breakdown voltage of about 5 V to about 10 V. In some embodiments, a high voltage transistor may be a transistor having a breakdown voltage of 10 V or higher. In some embodiments, a high voltage transistor may be a transistor having a breakdown voltage of about 10 V to about 30 V. The peripheral circuit structure PCS may include the peripheral circuit 30 of FIG. 1.

The cell array structure CAS may include a plurality of tiles 24. Each of the plurality of tiles 24 may include a plurality of memory cell blocks BLK1 to BLKp. Each of the plurality of memory cell blocks BLK1 to BLKp may include a plurality of memory cells, which may be three-dimensionally arranged.

Figure 3:
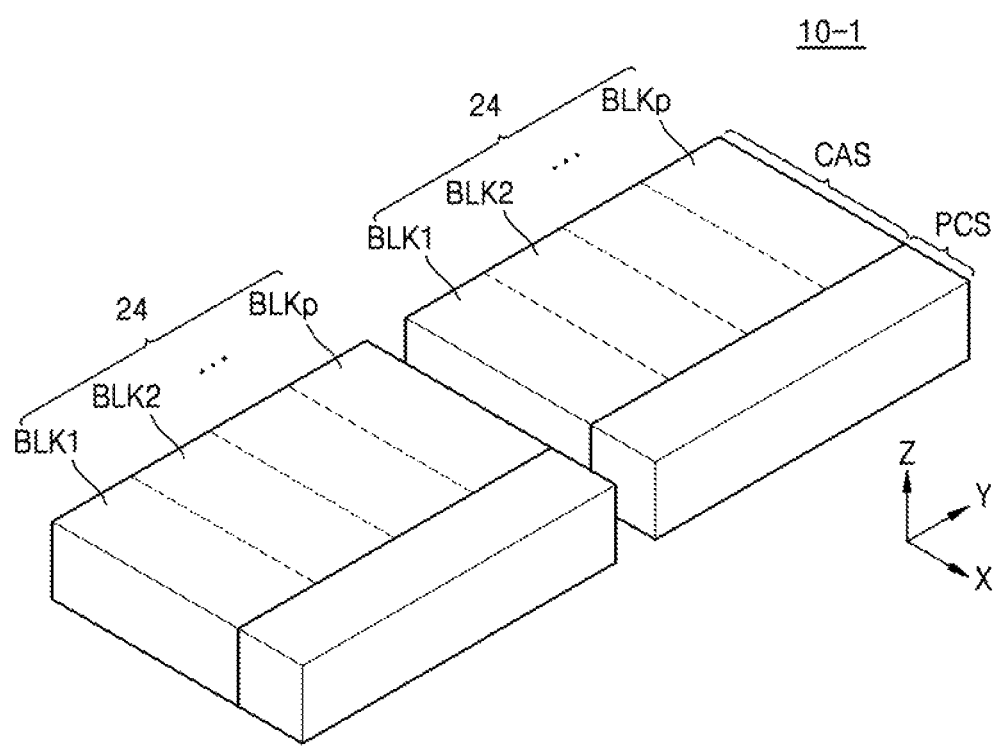
FIG. 3 is a schematic perspective view of a semiconductor device according to an embodiment of the inventive concept.

FIG. 3 is a schematic perspective view of a semiconductor device 10-1 according to an embodiment of the inventive concept.

Referring to FIG. 3, the semiconductor device 10-1 may include a cell array structure CAS and a peripheral circuit structure PCS, which may be arranged in the first direction, unlike the cell array structure CAS and peripheral circuit structure PCS of FIG. 2

The cell array structure CAS may include the memory cell array 20 of FIG. 1. In some embodiments, the peripheral circuit structure PCS may include the plurality of transistors described with reference to FIG. 2, such as MOS transistors or high voltage transistors. The peripheral circuit structure PCS may include the peripheral circuit 30 of FIG. 1.

Like in FIG. 2, the cell array structure CAS may include a plurality of tiles 24. Each of the plurality of tiles 24 may include a plurality of memory cell blocks BLK1 to BLKp. Each of the plurality of memory cell blocks BLK1 to BLKp may include memory cells, which may be three-dimensionally arranged.

Figure 4:
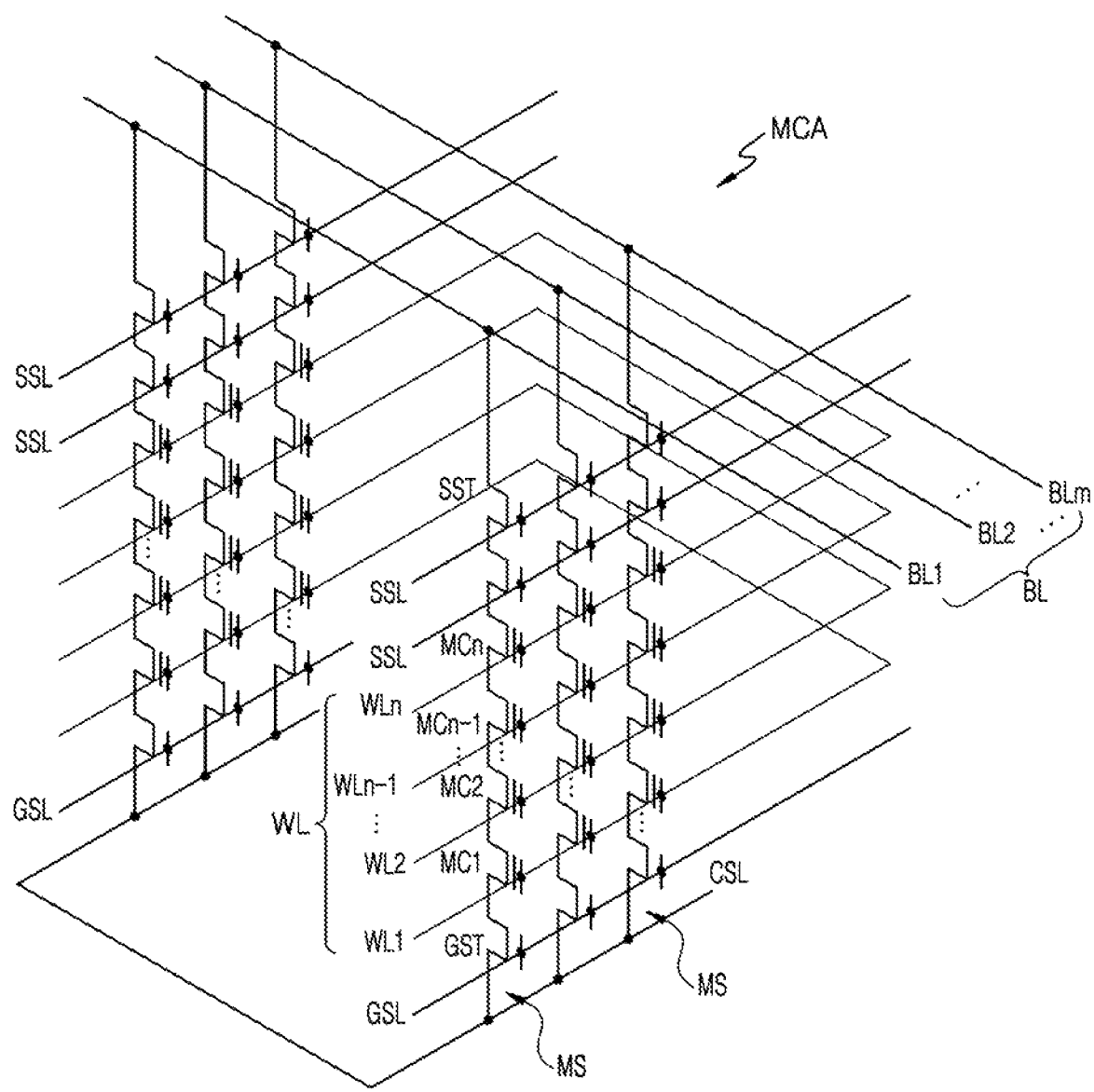
FIG. 4 is an equivalent circuit diagram of a memory cell array of a semiconductor device according to an embodiment of the inventive concept.

FIG. 4 is an equivalent circuit diagram of a memory cell array MCA of a semiconductor device according to an embodiment of the inventive concept.

Specifically, an equivalent circuit diagram of a vertical NAND flash memory device having a vertical channel structure is illustrated in FIG. 4. In an embodiment, each of the plurality of memory cell blocks BLK1 to BLKp illustrated in FIGS. 1 to 3 may include a memory cell array MCA having a circuit configuration illustrated in FIG. 4.

The memory cell array MCA may include a plurality of memory cell strings MS. The memory cell array MCA may include the plurality of bit lines BL (BL1 to BLm), the plurality of word lines WL (WL1 to WLn), at least one string selection line SSL, at least one ground selection line GSL, and a common source line CSL.

The plurality of memory cell strings MS may be formed between the plurality of bit lines BL and the common source line CSL. In FIG. 4, an example is illustrated where each of the plurality of memory cell strings MS includes one ground selection line GSL and two string selection lines SSL, but embodiments of the inventive concept are not necessarily limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1 to MCn. A drain region of the string selection transistor SST may be connected to a bit line BL, and a source region of the ground selection transistor GST may be connected to the common source line CSL. The common source line CSL may be a region which is connected to source regions of the plurality of ground selection transistors GST in common.

The string selection transistor SST may be connected to the string selection line SSL, and the ground selection transistor GST may be connected to the ground selection line GSL. Each of the plurality of memory cell transistors MC1 to MCn may be connected to a word line WL.

Figure 5:
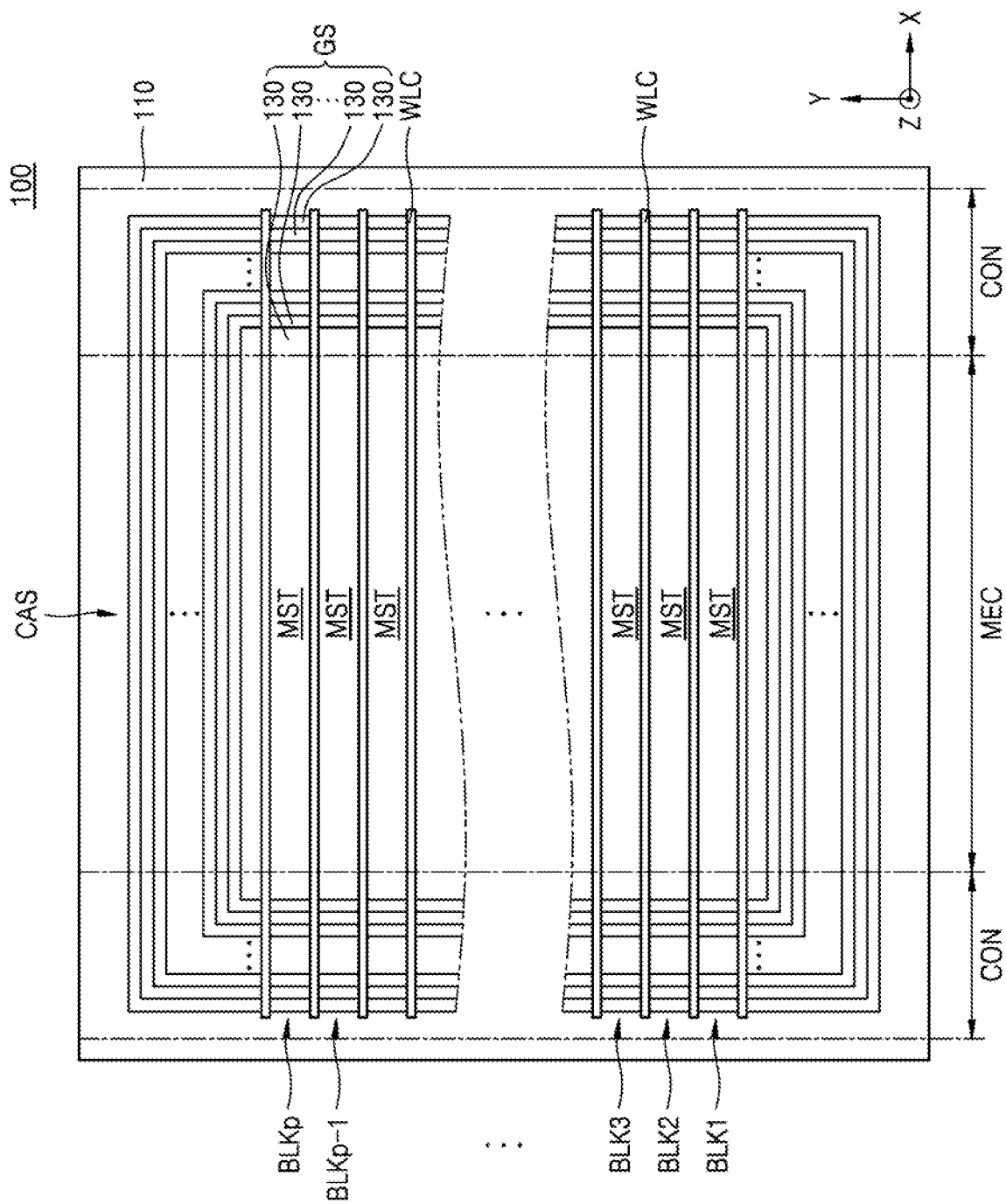
FIG. 5 is a schematic plan view of a partial region of a semiconductor device according to an embodiment of the inventive concept.

FIG. 5 is a schematic plan view of a partial region of a semiconductor device 100 according to an embodiment of the inventive concept.

Referring to FIG. 5, a cell array structure CAS of the semiconductor device 100 may include an upper substrate 110 and a plurality of memory cell blocks BLK1 to BLKp which may be arranged on the upper substrate 110.

A peripheral circuit structure PCS as shown in FIG. 2 may be arranged under the upper substrate 110. The plurality of memory cell blocks BLK1 to BLKp may overlap the peripheral circuit structure PCS in the third direction with the upper substrate 110 disposed therebetween. The peripheral circuit structure PCS arranged under the upper substrate 110 may include the peripheral circuit 30 of FIG. 1.

The cell array structure CAS may include a memory cell region MEC and a connection region CON that may be arranged at each of both sides of the memory cell region MEC in the first direction. Each of the plurality of memory cell blocks BLK1 to BLKp may include a memory stack structure MST, which may extend in the first direction over the memory cell region MEC and the connection region CON.

The memory stack structure MST may include a plurality of gate lines 130, which may be stacked to overlap each other in the third direction in the memory cell region MEC and the connection region CON of the upper substrate 110. In each of the plurality of memory stack structures MST, a gate stack GS may include the plurality of gate lines 130.

In each of the plurality of memory stack structures MST, the plurality of gate lines 130 may constitute the ground selection line GSL, the plurality of word lines WL, and the string selection line SSL illustrated in FIG. 4. The plurality of gate lines 130 may progressively reduce in area as a distance from the upper substrate 110 increases. A center portion of each of the plurality of gate lines 130 overlapping in the third direction may configure the memory cell region MEC, and an edge portion of each of the plurality of gate lines 130 may configure the connection region CON.

A plurality of word line cut structures WLC may extend long in the first direction in the memory cell region MEC and the connection region CON, and may be arranged on the upper substrate 110. The plurality of word line cut structures WLC may be spaced apart from one another in the second direction. The plurality of memory cell blocks BLK1 to BLKp may each be arranged between two adjacent word line cut structures WLC of the plurality of word line cut structures WLC.

Figure 6:
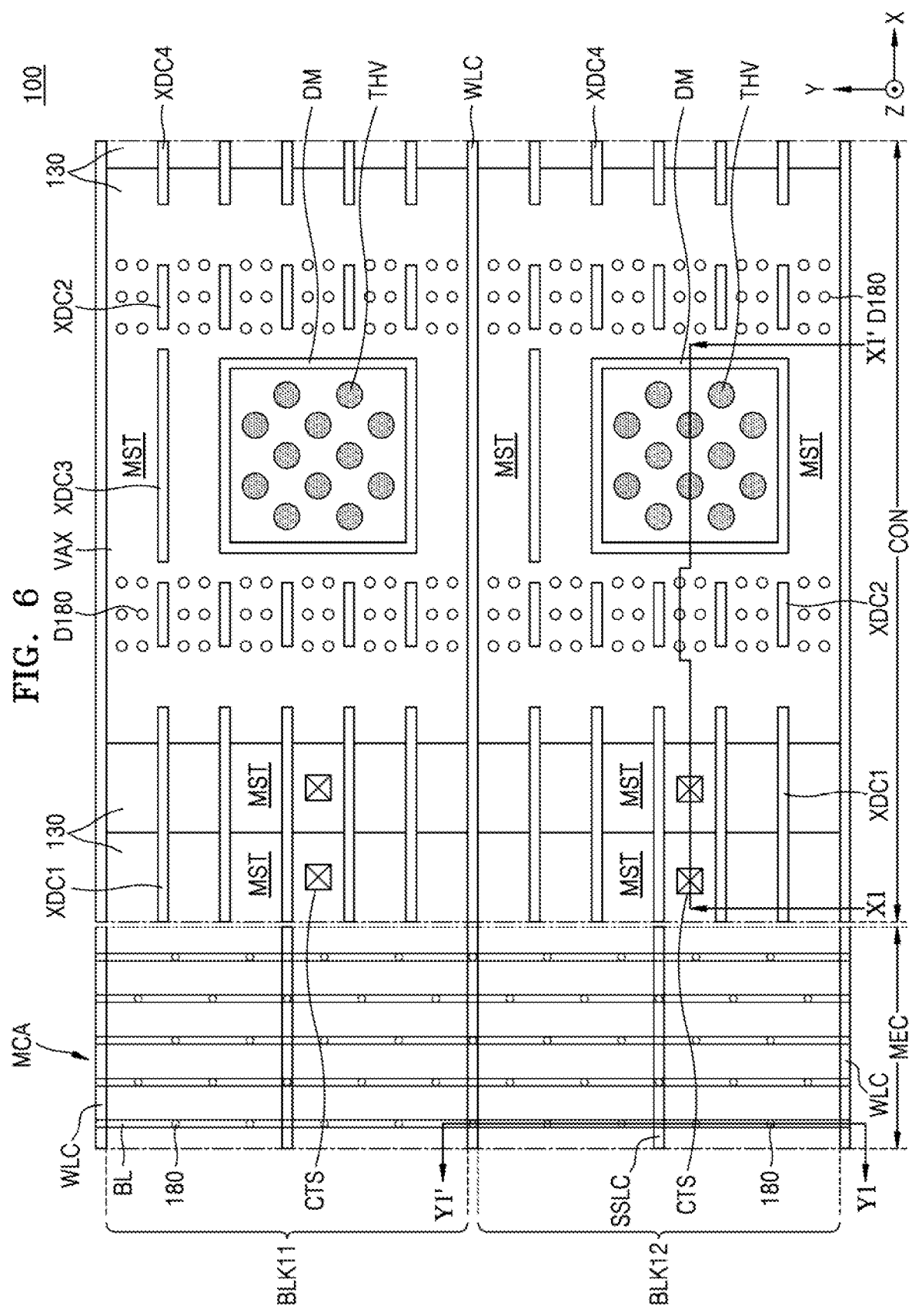
FIG. 6 is a plan view of memory cell blocks according to an embodiment of the inventive concept.
Figure 7:
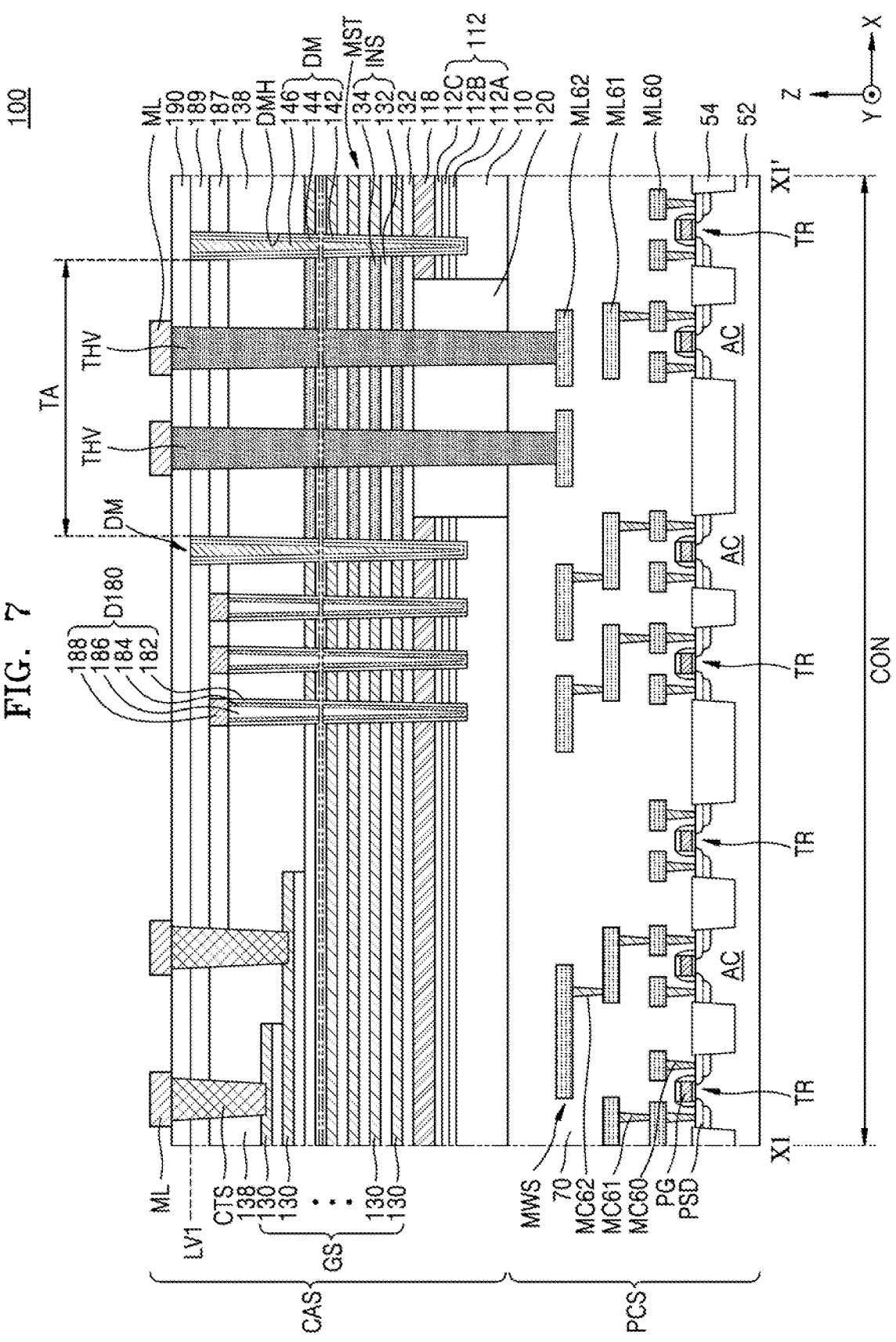
FIG. 7 is an enlarged cross-sectional view taken along line X1-X1' of FIG. 6.
Figure 8:
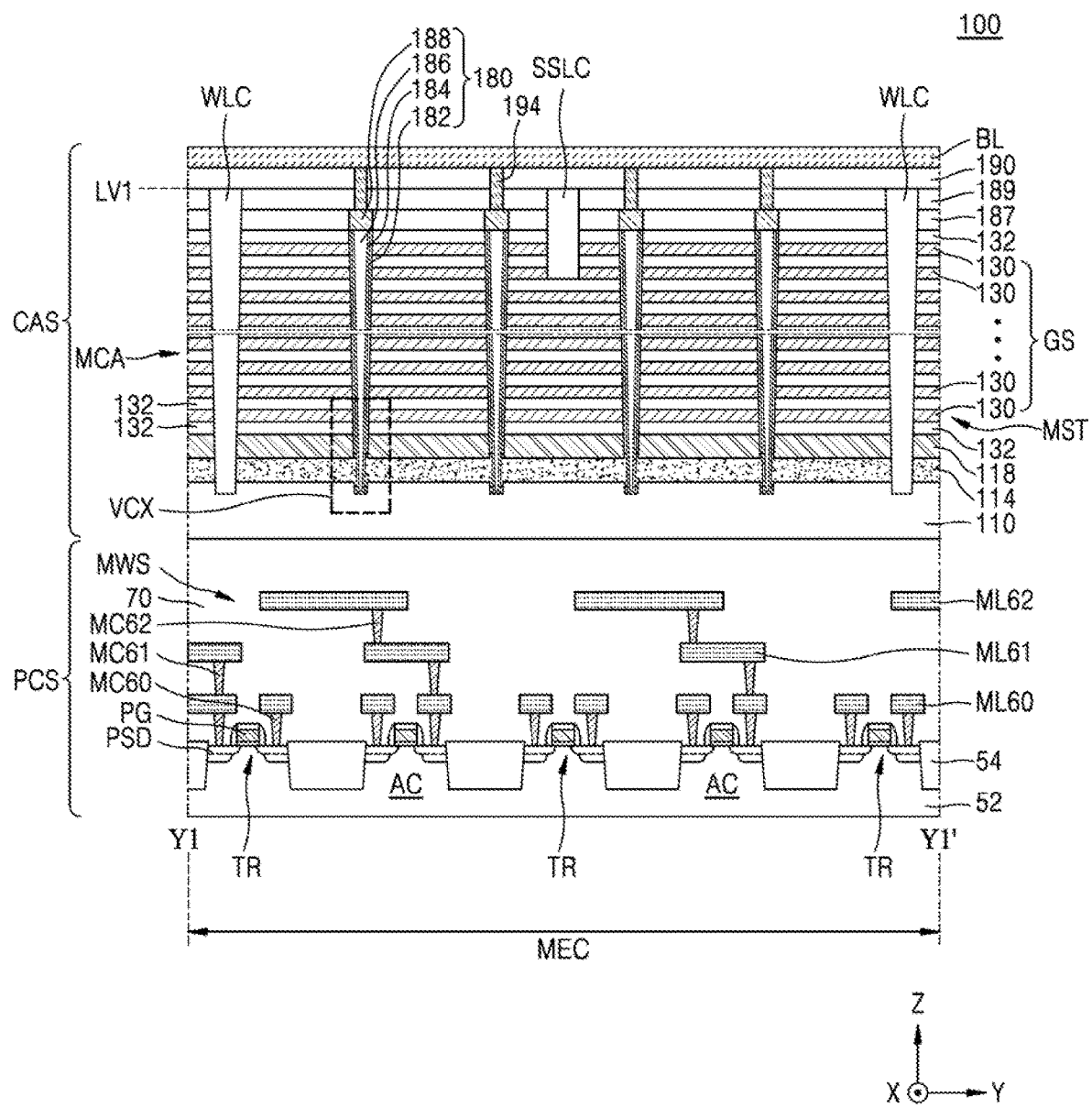
FIG. 8 is an enlarged cross-sectional view taken along line Y1-Y1' of FIG. 6.
Figure 9:
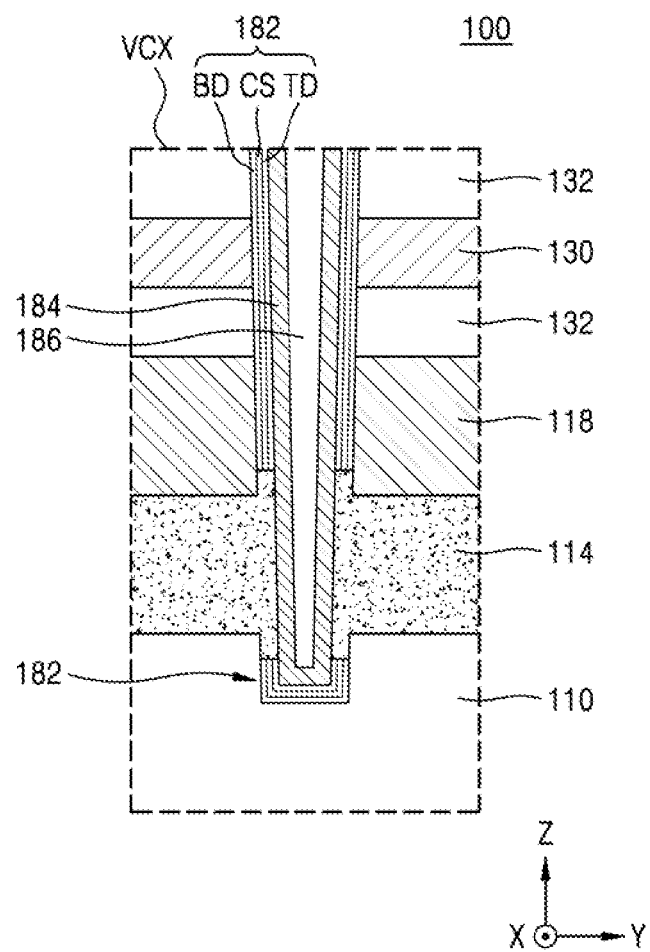
FIG. 9 is an enlarged cross-sectional view of region VCX of FIG. 8.

FIG. 6 is a plan view illustrating some elements of memory cell blocks BLK11 and BLK12, which may be understood to be representative of the plurality of memory cell blocks BLK1 to BLKp illustrated in FIG. 5. FIG. 7 is an enlarged cross-sectional view taken along line X1-X1' of FIG. 6. FIG. 8 is an enlarged cross-sectional view taken along line Y1-Y1' of FIG. 6. FIG. 9 is an enlarged cross-sectional view of region VCX in FIG. 8.

Referring to FIGS. 6 to 9, a semiconductor device 100 may include a peripheral circuit structure PCS and a cell array structure CAS which may be arranged on the peripheral circuit structure PCS and overlap the peripheral circuit structure PCS in the third direction, as shown in FIG. 2.

The cell array structure CAS may include an upper substrate 110, an insulation plate 112, a first conductive plate 114, a second conductive plate 118, and a memory stack structure MST. In the cell array structure CAS, the first conductive plate 114, the second conductive plate 118, and the memory stack structure MST may be sequentially stacked on the upper substrate 110 in the memory cell region MEC. In the cell array structure CAS, the insulation plate 112, the second conductive plate 118, and the memory stack structure MST may be sequentially stacked on the upper substrate 110 in the connection region CON.

The first conductive plate 114 and the second conductive plate 118 may perform a function of the common source line CSL of FIG. 3. The first conductive plate 114 and the second conductive plate 118 may function as a source region which may provide a current to a plurality of vertical memory cells included in the cell array structure CAS.

In some embodiments, the upper substrate 110 may include a semiconductor material such as polysilicon. Each of the first conductive plate 114 and the second conductive plate 118 may include doped polysilicon, a metal layer, or a combination thereof. The metal layer may include tungsten (W), but the metal layer may alternatively, or additionally include other materials.

The memory stack structure MST may include a gate stack GS. The gate stack GS may include a plurality of gate lines 130 which may extend in parallel in the first direction and may overlap one another in the third direction. Each of the plurality of gate lines 130 may include metal, metal silicide, an impurity-doped semiconductor, or a combination thereof. For example, each of the plurality of gate lines 130 may include metal such as tungsten, nickel, cobalt, or tantalum, metal silicide such as tungsten silicide, nickel silicide, cobalt silicide, or tantalum silicide, doped polysilicon, or a combination thereof.

An insulating layer 132 may be arranged between the second conductive plate 118 and the plurality of gate lines 130 and between two adjacent gate lines 130 of the plurality of gate lines 130. An uppermost gate line 130 of the plurality of gate lines 130 may be at least partially covered by the insulating layer 132. The insulating layer 132 may include silicon oxide.

In the memory cell region MEC and the connection region CON, the plurality of word line cut structures WLC may extend in the first direction on the upper substrate 110. A width in the second direction of each of the plurality of gate lines 130 included in the memory cell blocks BLK11 and BLK12 may be defined by the plurality of word line cut structures WLC.

Each word line cut structure WLC may include an insulation structure. In some embodiments, the insulation structure may include silicon oxide, silicon nitride, silicon oxynitride, or a low-k dielectric material. For example, the insulation structure may include a silicon oxide layer, a silicon nitride layer, a SiON layer, a SiOCN layer, a SiCN layer, or a combination thereof. In some embodiments, at least a portion of the insulation structure may include an air gap. As used herein, the term "air" may denote other gases which are included in air or are used in a manufacturing process, such as nitrogen.

A plurality of gate lines 130 constituting one gate stack GS may be vertically stacked on a second conductive plate 118 between two adjacent word line cut structures WLC. The plurality of gate lines 130 constituting one gate stack GS may include the ground selection line GSL, the plurality of word lines WL, and the string selection line SSL described above with reference to FIG. 4.

As illustrated in FIG. 8, two upper gate lines 130 of the plurality of gate lines 130 may be spaced apart from each other in the second direction with a string selection line cut structure SSLC disposed therebetween. The two upper gate lines 130 may configure the string selection line SSL described above with reference to FIG. 4.

In FIG. 8, an example in which one string selection line cut structure SSLC is formed in one gate stack GS is illustrated, but embodiments of the inventive concept are not necessarily limited thereto. For example, at least two string selection line cut structures SSLC may be formed in one gate stack GS. The string selection line cut structure SSLC may be filled with an insulating layer. In some embodiments, the string selection line cut structure SSLC may include an insulating layer which may include oxide, nitride, or a combination thereof. In some embodiments, at least a portion of the string selection line cut structure SSLC may include an air gap.

As illustrated in FIGS. 6 and 8, the plurality of channel structures 180 may pass through a plurality of gate lines 130, a plurality of insulating layers 132, the second conductive plate 118, and the first conductive plate 114, and may extend in the third direction on the upper substrate 110 in the memory cell region MEC. The plurality of channel structures 180 may be spaced apart from one another by a certain interval in the first direction and the second direction. The plurality of channel structures 180 may each include a gate dielectric layer 182, a channel region 184, a buried insulating layer 186, and a drain region 188.

As illustrated in FIG. 9, the gate dielectric layer 182 may include a tunneling dielectric layer TD, a charge storage layer CS, and a blocking dielectric layer BD, which may be formed sequentially from the channel region 184. However, a relative thickness of each of the tunneling dielectric layer TD, the charge storage layer CS, and the blocking dielectric layer BD is not limited to the illustration of FIG. 9, and may be variously modified.

The tunneling dielectric layer TD may include silicon oxide, hafnium oxide, aluminum oxide, zirconium oxide, or tantalum oxide. The charge storage layer CS may be a region which may store electrons passing through the tunneling dielectric layer TD from the channel region 184 and may include silicon nitride, boron nitride, silicon boron nitride, or impurity-doped polysilicon. The blocking dielectric layer BD may include silicon oxide, silicon nitride, or a metal oxide having a higher dielectric constant than silicon oxide. The metal oxide may include hafnium oxide, aluminum oxide, zirconium oxide, tantalum oxide, or a combination thereof.

As illustrated in FIG. 9, the first conductive plate 114 may pass through a partial region of the gate dielectric layer 182 in the first and/or second direction and may contact the channel region 184. In the first conductive plate 114, a thickness in the second direction of a portion adjacent to the gate dielectric layer 182 in the second direction may be greater than a thickness in the second direction of a portion adjacent to the second conductive plate 118 in the second direction.

The gate dielectric layer 182 may include a portion at least partially covering a sidewall of the channel region 184 above the first conductive plate 114, and a portion at least partially covering a bottom surface of the channel region below the first conductive plate 114. The lowermost portion of the gate dielectric layer 182 may be disposed between the channel region 184 and the upper substrate 110. A sidewall of the channel region 184 may contact the first conductive plate 114 and may be electrically connected to the first conductive plate 114.

As illustrated in FIGS. 8 and 9, the channel region 184 may have a cylinder shape. The channel region 184 may include doped polysilicon or undoped polysilicon. The buried insulating layer 186 may fill an inner space of the channel region 184. The buried insulating layer 186 may include an insulating material. For example, the buried insulating layer 186 may include silicon oxide, silicon nitride, silicon oxynitride, or a combination thereof. In some embodiments, the buried insulating layer 186 may be omitted, and the channel region 184 may instead have a pillar structure which is not hollow.

The drain region 188 may include doped polysilicon. A plurality of drain regions 188 may be insulated from one another by a first upper insulating layer 187. In the memory cell region MEC, a plurality of channel structures 180 and a first upper insulating layer 187 may be at least partially covered by a second upper insulating layer 189.

The string selection line cut structure SSLC may pass through the first upper insulating layer 187 and the second upper insulating layer 189 in the third direction. A top surface of the string selection line cut structure SSLC, a top surface of the word line cut structure WLC, and a top surface of the second upper insulating layer 189 may extend at a first level LV1 of the upper substrate 110. The string selection line cut structure SSLC, the word line cut structure WLC, and the second upper insulating layer 189 may be at least partially covered by a third upper insulating layer 190. The first upper insulating layer 187, the second upper insulating layer 189, and the third upper insulating layer 190 may each include oxide, nitride, or a combination thereof.

As illustrated in FIGS. 6 and 8, in the memory cell region MEC of the memory stack structure MST, a plurality of bit lines BL may be arranged on the third upper insulating layer 190. The plurality of bit lines BL may extend in parallel in the second direction. Each of the plurality of channel structures 180 may be connected to the plurality of bit lines BL through a plurality of contact plugs 194, which may pass through the second upper insulating layer 189 and the third upper insulating layer 190.

As illustrated in FIG. 7, in the connection region CON of the memory stack structure MST, the insulation plate 112 and the second conductive plate 118 may be sequentially stacked on the upper substrate 110. The insulation plate 112 may include an insulating layer having a multi-layer structure including a first insulating layer 112A, a second insulating layer 112B, and a third insulating layer 112C, which may be sequentially stacked on the upper substrate 110.

In some embodiments, the first insulating layer 112A and the third insulating layer 112C may include silicon oxide, and the second insulating layer 112B may include silicon nitride. In the connection region CON, an edge portion of each of a plurality of gate lines 130 and a plurality of insulating layers 132 may be at least partially covered by an interlayer insulating layer 138. The interlayer insulating layer 138 may include silicon oxide, but the interlayer insulating layer 138 may alternatively, or additionally include other materials.

As illustrated in FIGS. 6 and 7, in the connection region CON, a plurality of dummy channel structures D180 may pass through the interlayer insulating layer 138, the plurality of gate lines 130, the plurality of insulating layers 132, the second conductive plate 118, and the insulation plate 112 and may extend in the third direction. The plurality of dummy channel structures D180 may be spaced apart from one another by a certain interval in the first direction and the second direction. Similar to the plurality of channel structures 180, the plurality of dummy channel structures D180 may include a gate dielectric layer 182, a channel region 184, a buried insulating layer 186, and a drain region 188. In some embodiments, a size of each of the plurality of dummy channel structures D180 in the first and third directions may be greater than that of the plurality of channel structures 180.

As illustrated in FIG. 7, in the connection region CON, the interlayer insulating layer 138 may be covered by the first upper insulating layer 187. The drain region 188 of each of the plurality of dummy channel structures D180 may be insulated from an adjacent drain region 188 by the first upper insulating layer 187. In the connection region CON, the plurality of dummy channel structures D180 and the first upper insulating layer 187 may be at least partially covered by the second upper insulating layer 189.

As illustrated in FIGS. 6 and 7, each of memory cell blocks BLK11 and BLK12 between two adjacent word line cut structures WLC in the connection region CON may include a dam structure DM. The dam structure DM may pass through the interlayer insulating layer 138, the plurality of gate lines 130, the plurality of insulating layers 132, the second conductive plate 118, and the insulation plate 112 and may extend in the third direction on the upper substrate 110.

The dam structure DM may include a first insulation liner 142, a second insulation liner 144, and a main plug 146, which may be sequentially stacked toward an inner portion of a dam hole DMH from an inner wall of the dam hole DMH which may pass through the interlayer insulating layer 138, the plurality of gate lines 130, the plurality of insulating layers 132, the second conductive plate 118, and the insulation plate 112.

In some embodiments, the first insulation liner 142 may include silicon oxide, the second insulation liner 144 may include silicon nitride, and the main plug 146 may include polysilicon. However, the first insulation liner 142 and the second insulation liner 144 may alternatively, or additionally include other materials.

In FIG. 6, an embodiment in which one dam structure DM is arranged between two adjacent word line cut structures WLC is illustrated, but embodiments of the inventive concept are not necessarily limited thereto. For example, a plurality of dam structures DM may be arranged in one row in the second direction and may be spaced apart from one another between two adjacent word line cut structures WLC.

As illustrated in FIG. 6, a plurality of dummy word line cut structures XDC1, XDC2, XDC3, and XDC4 may be arranged in each of the memory cell blocks BLK11 and BLK12. Similar to the plurality of word line cut structures WLC, each of the plurality of dummy word line cut structures XDC1, XDC2, XDC3, and XDC4 may extend in the first direction.

Similar to the dam structure DM, in the connection region CON, each of the plurality of dummy word line cut structures XDC1, XDC2, XDC3, and XDC4 may pass through the interlayer insulating layer 138, the plurality of gate lines 130, the plurality of insulating layers 132, the second conductive plate 118, and the insulation plate 112 and may extend in the third direction on the upper substrate 110. A material of each of the plurality of dummy word line cut structures XDC1, XDC2, XDC3, and XDC4 may be the same as that of each of the plurality of word line cut structures WLC described above.

As illustrated in FIG. 7, an insulation plug 120 passing through the upper substrate 110, the insulation plate 112, and the second conductive plate 118 may be arranged in a partial region of the connection region CON. The insulation plug 120 may be arranged in a region which may be vertically adjacent to a through via region TA defined by the dam structure DM. The insulation plug 120 may include silicon oxide, silicon nitride, or a combination thereof.

A portion of the through via region TA defined by the dam structure DM may be filled with an insulation island INS. The insulation island INS may be spaced apart from a plurality of gate lines 130, with the dam structure DM disposed therebetween. The insulation island INS may include a multi-insulating layer in which an insulating layer 132 and a sacrificial insulating layer 134 are alternately stacked a plurality of times. In the insulation island INS, the insulating layer 132 may include silicon oxide, and the sacrificial insulating layer 134 may include silicon nitride.

In some embodiments, the insulation island INS may include a single insulating layer. In the through via region TA defined by the dam structure DM, an upper portion of the insulation island INS may be filled with a portion of the interlayer insulating layer 138, a portion of the first upper insulating layer 187, and a portion of the second upper insulating layer 189.

In the through via region TA defined by the dam structure DM, a plurality of through vias THV may pass through the insulation island INS, the interlayer insulating layer 138, the first upper insulating layer 187, the second upper insulating layer 189, and the third upper insulating layer 190, and may extend in the third direction. A top surface of each of the plurality of through vias THV may contact a wiring layer ML formed on the third upper insulating layer 190.

Each of the plurality of through vias THV may pass through the insulation plug 120 and may extend in the third direction up to the peripheral circuit structure PCS. Each of the plurality of through vias THV may include a portion surrounded by the insulation plug 120 and the insulation island INS. The plurality of through vias THV may be connected to a peripheral circuit included in the peripheral circuit structure PCS. Each of the plurality of through vias THV may include tungsten, titanium, tantalum, copper, aluminum, titanium nitride, tantalum nitride, tungsten nitride, or a combination thereof.

As illustrated in FIG. 7, a plurality of contact structures CTS respectively connected to the plurality of gate lines 130 may be arranged in the connection region CON. Each of the plurality of contact structures CTS may pass through the interlayer insulating layer 138, the first upper insulating layer 187, the second upper insulating layer 189, and the third upper insulating layer 190 from an edge portion of a corresponding gate line of the plurality of gate lines 130 and may extend in the third direction.

A top surface of each of the plurality of contact structures CTS may contact the wiring layer ML formed on the third upper insulating layer 190. In the connection region CON, a plurality of wiring layers ML formed on the third upper insulating layer 190 may be arranged at the same level as the plurality of bit lines BL arranged in the memory cell region MEC. The plurality of contact structures CTS and the plurality of wiring layers ML may each include tungsten, titanium, tantalum, copper, aluminum, titanium nitride, tantalum nitride, tungsten nitride, or a combination thereof.

As illustrated in FIGS. 7 and 8, the peripheral circuit structure PCS may include a lower substrate 52, a plurality of peripheral circuits formed on the lower substrate 52, and a multilayer wiring structure MWS which may connect the plurality of peripheral circuits to each other or may connect the plurality of peripheral circuits to elements in the memory cell region MEC.

The lower substrate 52 may include a semiconductor substrate. For example, the lower substrate 52 may include silicon (Si), germanium (Ge), or SiGe. An active region AC may be provided in the lower substrate 52 by an isolation region 54. The active region AC may be a well region doped with impurities of the same conductivity type as the lower substrate 52. In some embodiments, the active region AC may be a p-type well region.

A plurality of transistors TR constituting peripheral circuits may be formed on the active region AC. Each of the plurality of transistors TR may include a gate PG and a plurality of source and drain regions PSD which may be formed in the active region AC on both sides of the gate PG. The plurality of source and drain regions PSD may be doped regions doped with impurities of a conductivity type different from that of the lower substrate 52. In some embodiments, the plurality of source and drain regions PSD may be n-type regions.

The plurality of peripheral circuits included in the peripheral circuit structure PCS may include various circuits included in the peripheral circuit 30 described above with reference to FIG. 1. In some embodiments, the plurality of peripheral circuits included in the peripheral circuit structure PCS may each include the row decoder 32, the page buffer 34, the data I/O circuit 36, the control logic 38, and the common source line driver 39 illustrated in FIG. 1.

The multilayer wiring structure MWS included in the peripheral circuit structure PCS may include a plurality of peripheral circuit wiring layers ML60, ML61, and ML62 and a plurality of peripheral circuit contacts MC60, MC61, and MC62. At least some of the plurality of peripheral circuit wiring layers ML60, ML61, and ML62 may be electrically connected to a transistor TR. The plurality of peripheral circuit contacts MC60, MC61, and MC62 may connect some transistors TR from among the plurality of transistors TR, to some peripheral circuit wiring layers from among the plurality of peripheral circuit wiring layers ML60, ML61, and ML62.

Each of the plurality of through vias THV arranged in the connection region CON of the cell array structure CAS may be connected to at least one peripheral circuit from among the plurality of peripheral circuits through the multilayer wiring structure MWS included in the peripheral circuit structure PCS. The plurality of through vias THV may be connected to one of the plurality of peripheral circuit wiring layers ML60, ML61, and ML62. For example, each of the plurality of through vias THV may contact an uppermost peripheral circuit wiring layer ML62 closest to the cell array structure CAS of the plurality of peripheral circuit wiring layers ML60, ML61, and ML62. In FIGS. 7 and 8, the multilayer wiring structure MWS is illustrated as including a three-layer wiring layer in the third direction, but embodiments of the inventive concept are not limited thereto. For example, the multilayer wiring structure MWS may include a two-layer or four or more-layer wiring layer.

The plurality of peripheral circuit wiring layers ML60, ML61, and ML62 and the plurality of peripheral circuit contacts MC60, MC61, and MC62 may each include metal, conductive metal nitride, metal silicide, or a combination thereof. For example, the plurality of peripheral circuit wiring layers ML60, ML61, and ML62 and the plurality of peripheral circuit contacts MC60, MC61, and MC62 may each include a conductive material such as tungsten, molybdenum, titanium, cobalt, tantalum, nickel, tungsten silicide, titanium silicide, cobalt silicide, tantalum silicide, or nickel silicide.

The plurality of transistors TR and the multilayer wiring structure MWS included in the peripheral circuit structure PCS may be at least partially covered by an interlayer insulating layer 70. The plurality of through vias THV may pass through a portion of the interlayer insulating layer 70 and may contact a top surface of the peripheral circuit wiring layer ML62. The interlayer insulating layer 70 may include silicon oxide, SiON, or SiOCN. In FIG. 7, the peripheral circuit structure PCS is illustrated in an X-Z cross-section for convenience, but may have the same shape in a Y-Z cross-section.

Figure 10:
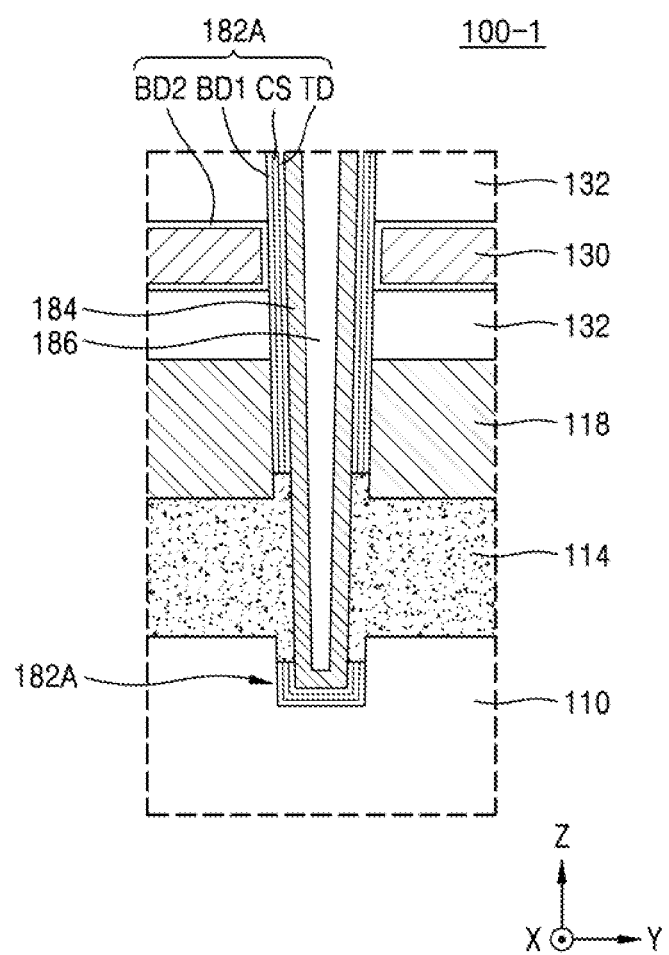
FIG. 10 is a diagram of a semiconductor device according to an embodiment of the inventive concept.

FIG. 10 is a diagram of a semiconductor device 100-1 according to an embodiment of the inventive concept.

Specifically, FIG. 10 is an enlarged cross-sectional view of a portion of the semiconductor device 100-1 corresponding to a region VCX of FIG. 8. The semiconductor device 100-1 may have the same configuration as the semiconductor device 100 described with reference to FIGS. 6 to 9 except for a gate dielectric layer 182A. Descriptions of FIG. 10 which are the same as those of FIGS. 6 to 9 will be briefly given or omitted.

The gate dielectric layer 182A may have substantially the same configuration as the gate dielectric layer 182 of FIGS. 7 and 8. The gate dielectric layer 182A may include a first blocking dielectric layer BD1 and a second blocking dielectric layer BD2 instead of the blocking dielectric layer BD of FIGS. 7 and 8. The first blocking dielectric layer BD1 may extend in parallel with the channel region 184 and the second blocking dielectric layer BD2 may surround the gate line 130.

Each of the first blocking dielectric layer BD1 and the second blocking dielectric layer BD2 may include silicon oxide, silicon nitride, or metal nitride. For example, the first blocking dielectric layer BD1 may include silicon oxide, and the second blocking dielectric layer BD2 may include metal oxide, which is greater in permittivity than silicon oxide. The metal oxide may include hafnium oxide, aluminum oxide, zirconium oxide, tantalum oxide, or a combination thereof.

Figure 11:
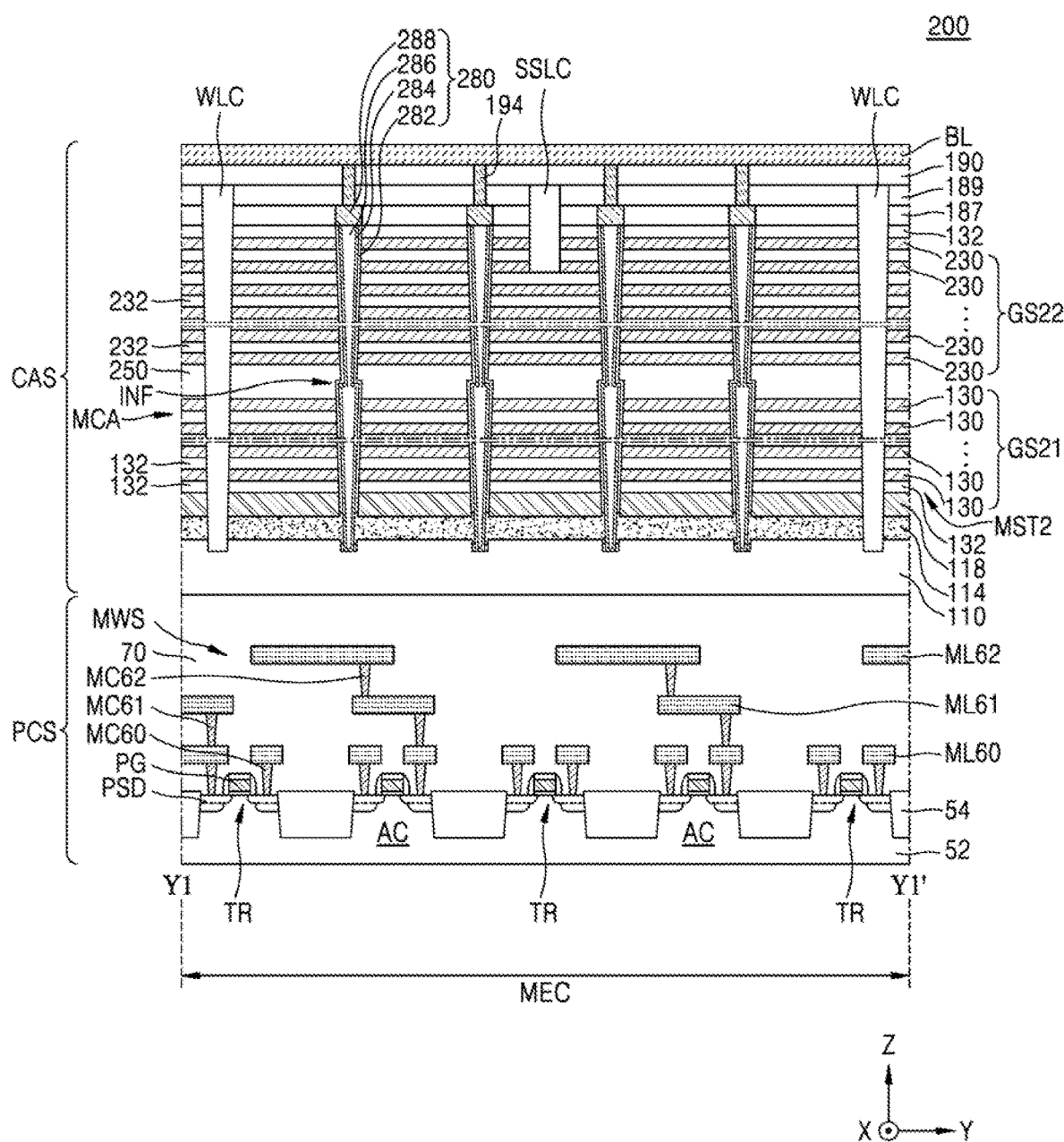
FIG. 11 is a cross-sectional view of a semiconductor device according to an embodiment of the inventive concept.

FIG. 11 is a cross-sectional view of a semiconductor device 200 according to an embodiment of the inventive concept.

Specifically, enlarged cross-sectional configurations of some elements in the semiconductor device 200 of a region which corresponds to a cross-section taken along line Y1-Y1' of FIG. 6 are illustrated. In FIG. 11, the same reference numerals as FIGS. 6 to 9 refer to like elements, and repeated descriptions will be briefly given or omitted.

The semiconductor device 200 may have substantially the same configuration as the semiconductor device 100 described above with reference to FIGS. 6 to 9. However, a cell array structure CAS of the semiconductor device 200 may include a memory stack structure MST2 instead of the memory stack structure MST.

The memory stack structure MST2 may include a lower gate stack GS21 including a plurality of gate lines 130 and an upper gate stack GS22 including a plurality of gate lines 230. In the lower gate stack GS21, an insulating layer 132 may be arranged between two adjacent gate lines 130 of the plurality of gate lines 130. In the upper gate stack GS22, an insulating layer 232 may be arranged between two adjacent gate lines 230 of the plurality of gate lines 230. A middle insulating layer 250 having a greater thickness in the third direction than that of the insulating layer 132 or the insulating layer 232 may be arranged between the lower gate stack GS21 and the upper gate stack GS22. The insulating layer 232 and the middle insulating layer 250 may each include silicon oxide.

In some embodiments, the lower gate stack GS21 may include 48, 64, or 96 gate lines 130 which may be stacked to overlap one another in the third direction, and the upper gate stack GS22 may include 48, 64, or 96 gate lines 230 which may be stacked to overlap one another in the third direction. However, embodiments of the inventive concept are not necessarily limited thereto. For example, a sum of the number of gate lines 130 constituting the lower gate stack GS21 and the number of gate lines 230 constituting the upper gate stack GS22 may be at least 128.

In a memory cell region MEC of a cell array structure CAS, a plurality of channel structures 280 may pass through the plurality of gate lines 230, a plurality of insulating layers 232, the middle insulating layer 250, the plurality of gate lines 130, a plurality of insulating layers 132, a second conductive plate 118, and a first conductive plate 114, and may extend in the third direction on the upper substrate 110.

The plurality of channel structures 280 may include a gate dielectric layer 282, a channel region 284, a buried insulating layer 286, and a drain region 288. The gate dielectric layer 282, the channel region 284, the buried insulating layer 286, and the drain region 288 may respectively have the same configurations as the gate dielectric layer 182, the channel region 184, the buried insulating layer 186, and the drain region 188 included in the plurality of channel structures 180 of FIGS. 6 and 8.

Each of the gate dielectric layer 282, the channel region 284, and the buried insulating layer 286 included in the plurality of channel structures 280 may include an inflection portion INF in a region surrounded by the middle insulating layer 250. The inflection portion INF may be formed in a process of manufacturing the semiconductor device 200. The inflection portion INF may be formed in each of the gate dielectric layer 282, the channel region 284, and the buried insulating layer 286 due to a second-direction width difference between a lower channel hole and an upper channel hole, near a region in which the lower channel hole contacts the upper channel hole, the lower channel hole being formed in the lower gate stack GS21 and the insulating layer 132 and the upper channel hole being formed in the upper gate stack GS22 and the insulating layer 132.

More detailed configurations of the gate dielectric layer 282, the channel region 284, the buried insulating layer 286, and the drain region 288 may be substantially the same as those of the gate dielectric layer 182, the channel region 184, the buried insulating layer 186, and the drain region 188 described above with reference to FIGS. 6 to 8.

The semiconductor device 200 may include a peripheral circuit structure PCS. In the peripheral circuit structure PCS, a plurality of transistors TR constituting peripheral circuits may be formed on the active region AC. Each of the plurality of transistors TR may include a gate PG and a plurality of source and drain regions PSD formed in the active region AC on both sides of the gate PG. Transistors constituting the peripheral circuit structure PCS may be the same as those described above with reference to FIGS. 6 to 8.

Figure 12:
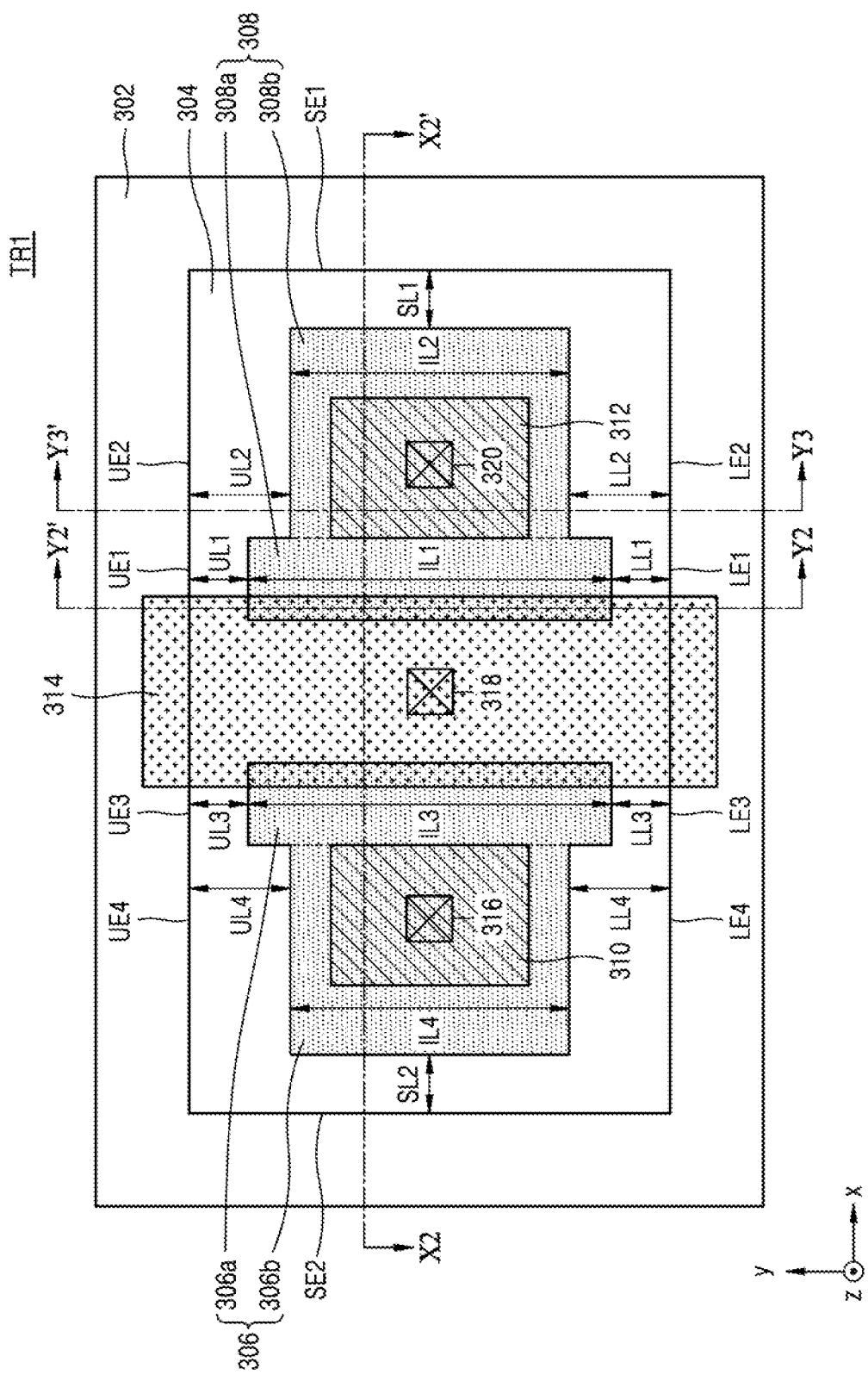
FIG. 12 is a plan view of a transistor included in a semiconductor device according to an embodiment of the inventive concept.

FIG. 12 is a plan view of a transistor included in a semiconductor device according to an embodiment of the inventive concept.

Specifically, FIG. 12 may be a diagram of a transistor TR1 among the plurality of transistors TR included in the semiconductor device 10, 10-1, 100, 100-1, or 200 described above. FIG. 12 may be a diagram one of a transistor TR1 among the plurality of transistors TR included in a peripheral circuit (e.g., the peripheral circuit 30 of FIG. 1) in the peripheral circuit structure PCS of the semiconductor device 10, 10-1, 100, 100-1, or 200 described above. In FIG. 12, the first direction may be a channel length direction and the second direction may be a channel width direction.

The transistor TR1 may include an isolation region 302, an active region 304, a gate 314, and source and drain regions 306, 310, 308, and 312. The isolation region 302 and the active region 304 may correspond to the isolation region 54 and the active region AC of FIGS. 7, 8 and 11, respectively. The gate 314 and the source and drain regions 306, 310, 308, and 312 may correspond to the gate PG and the source and drain regions PSD of FIGS. 7, 8, and 11, respectively.

As illustrated in FIG. 12, the active region 304 may be arranged in the isolation region 302. The active region 304 may be defined by the isolation region 302. The gate 314 may extend in the second direction on the active region 304. The gate 314 may be arranged in the middle of the active region 304. The gate 314 may partially extend onto and overlap the isolation region 302. A gate contact 318 may be arranged on the gate 314. Although only one gate contact 318 is illustrated, a plurality of gate contacts 318 may be formed.

The source and drain regions 306, 310, 308, and 312 may extend in the first direction perpendicular to the second direction in the active regions 304 on both sides of the gate 314, respectively. The source and drain regions 306, 310, 308, and 312 may include source regions (that is, a low-concentration source doping region 306 and a high-concentration source doping region 310) and drain regions (that is, a low-concentration drain doping region 308 and a high-concentration drain doping region 312).

The source and drain regions 306, 310, 308, and 312 may be regions doped with impurities having a conductivity type opposite to that of the active region 304. In some embodiments, the active region 304 may be a region doped with p-type impurities, and the source and drain regions 306, 310, 308, and 312 may be regions doped with n-type impurities.

As described above, the source and drain regions 306, 310, 308, and 312 may include a low-concentration source doping region 306, a high-concentration source doping region 310, a low-concentration drain doping region 308, and a high-concentration drain doping region 312. The low-concentration source and drain doping regions 306 and 308 may include first low-concentration source and drain doping regions 306a and 308a arranged in a gate-adjacent region adjacent to the gate 314 and second low-concentration source and drain doping regions 306b and 308b arranged in a gate-distant region separated from the gate 314 by the gate-adjacent region.

The low-concentration source and drain doping regions 306 and 308 may be referred to as lightly doped drain (LDD) regions. In the transistor TR1, the first low-concentration source and drain doping regions 306a and 308a and the second low-concentration source and drain doping regions 306b and 308b may have a symmetrical structure with respect to the gate 314 in the first direction.

The first low-concentration source and drain doping regions 306a and 308a and the second low-concentration source and drain doping regions 306b and 308b may constitute the low-concentration source and drain doping regions 306 and 308. Some regions of the first low-concentration source and drain doping regions 306a and 308a may overlap the gate 314. First lengths IL3 and IL1 of the first low-concentration source and drain doping regions 306a and 308a in the second direction may be greater than second lengths IL4 and IL2 of the second low-concentration source and drain doping regions 306b and 308b in the second direction. In some embodiments, the first lengths IL3 and IL1 and the second lengths IL4 and IL2 may be several micrometers (μm) to several tens of μm.

The first low-concentration source and drain doping regions 306a and 308a may include a first low-concentration source doping region 306a and a first low-concentration drain doping region 308a. The second low-concentration source and drain doping regions 306b and 308b may include a second low-concentration source doping region 306b and a second low-concentration drain doping region 308b.

The first length IL3 of the first low-concentration source doping region 306a in the second direction may be greater than the second length IL4 of the second low-concentration source doping region 306b in the second direction. The first length IL1 of the first low-concentration drain doping region 308a in the second direction may be greater than the second length IL2 of the second low-concentration drain doping region 308b in the second direction.

The source and drain regions 306, 310, 308, and 312 may include, in the second low-concentration source and drain doping regions 306b and 308b, high-concentration source and drain doping regions 310 and 312, each having a higher doping concentration than low-concentration source and drain doping regions 306 and 308. The high-concentration source and drain doping regions 310 and 312 may be surrounded by the first low-concentration source and drain doping regions 306a and 306b and the second low-concentration source and drain doping regions 308a and 308b, respectively.

The high-concentration source and drain doping regions 310 and 312 may include a high-concentration source doping region 310 and a high-concentration drain doping region 312. Source and drain contacts 316 and 320 may be located on the high-concentration source and drain doping regions 310 and 312, respectively. Although only one source contact 316 and only one drain contact 320 are illustrated, a plurality of source contacts and a plurality of drain contacts may be disposed in the transistor TR1.

Hereinafter, the arrangement of the low-concentration source and drain doping regions 306a, 308a, 306b and 308b located on the active region 304 in the isolation region 302 will be described in more detail.

The isolation region 302 may include first edges UE3, LE3, UE1, and LE1 located inside upper and lower sides of the gate-adjacent region in the second direction, second edges UE4, LE4, UE2, and LE2 located inside upper and lower sides of the gate-distant region in the second direction, and side edges SE2 and SE1 located inside a side surface of the gate-distant region in the first direction.

Among the low-concentration source and drain doping regions 306a, 308a, 306b, and 308b, the first low-concentration source and drain doping regions 306a and 308a in the gate-adjacent region may be respectively spaced apart, by first separation distances UL3, LL3, UL1, and LL1, from the first edges UE3, LE3, UE1, and LE1 located inside upper and lower sides of the isolation region 304 in the second direction. In some embodiments, each of the first separation distances UL3, LL3, UL1, and LL1 may be several μm. In some embodiments, each of the first separation distances UL3, LL3, UL1, and LL1 may be about 100 nanometers (nm) to about 500 nm.

The first edges UE3, LE3, UE1, and LE1 may include first upper edges UE3 and UE1 located above the isolation region 304 and first lower edges LE3 and LE1 located below the isolation region 304. The first separation distances UL3, LL3, UL1, and LL1 may include first upper separation distances UL3 and UL1 spaced apart from the first upper edges UE3 and UE1 in the second direction, and first lower separation distances LL3 and LL1 spaced apart from the first lower edges LE3 and LE1 in the second direction. The first upper separation distances UL3 and UL1 may be equal to the first lower separation distances LL3 and LL1, respectively.

The first low-concentration source doping region 306a may be spaced apart, by a first source upper separation distance (i.e., the first upper separation distance UL3), from a first source upper edge (i.e., the first upper edge UE3) located inside the upper side of the isolation region 304 in the second direction. The first low-concentration source doping region 306a may be spaced apart, by a first source lower separation distance (i.e., the first lower separation distance LL3), from a first source lower edge (i.e., the first lower edge LE3) located inside the lower side of the isolation region 304 in the second direction. The first source upper separation distance (i.e., the first upper separation distance UL3) may be equal to the first source lower separation distance (i.e., the first lower separation distance LL3).

The first low-concentration drain doping region 308a may be spaced apart, by a first drain upper separation distance (i.e., the first upper separation distance UL1), from a first drain upper edge (i.e., the first upper edge UE1) located inside the upper side of the isolation region 304 in the second direction. The first low-concentration drain doping region 308a may be spaced apart, by a first drain lower separation distance (i.e., the first lower separation distance LL1), from a first drain lower edge (i.e., the first lower edge LE1) located inside the lower side of the isolation region 304 in the second direction. The first drain upper separation distance (i.e., the first upper separation distance UL1) may be equal to the first drain lower separation distance (i.e., the first lower separation distance LL1).

As described above, when the first low-concentration source and drain doping regions 306a and 308a are spaced apart from the isolation region 304 by the first separation distances UL3, LL3, UL1, and LL1, a decrease in a breakdown voltage may be suppressed by suppressing an increase in an electric field at the first edges UE3, LE3, UE1, and LE1 of the isolation region 304 during the operation of the transistor TR1. In addition, in an embodiment of the inventive concept, the first separation distances UL3, LL3, UL1, and LL1 may be less than second separation distances UL4, LL4, UL2, and LL2, respectively, from the isolation region 304 of the second low-concentration source and drain doping regions 308a and 308b, as described below, and thus, an increased current may be promoted.

Among the low-concentration source and drain doping regions 306a, 308a, 306b, and 308b, the second low-concentration source and drain doping regions 306b and 308b in the gate-distant region may be respectively spaced apart, by the second separation distances UL4, LL4, UL2, and LL2, from the second edges UE4, LE4, UE2, and LE2 located inside the upper and lower sides of the isolation region 304 in the second direction. In some embodiments, each of the second separation distances UL4, LL4, UL2, and LL2 may be several μm. In some embodiments, each of the second separation distances UL4, LL4, UL2, and LL2 may be about 100 nm to about 500 nm.

The second edges UE4, LE4, UE2, and LE2 may include second upper edges UE4 and UE2 located above the isolation region 304 and second lower edges LE4 and LE2 located below the isolation region 304. The second separation distances UL4, LL4, UL2, and LL2 may include second upper separation distances UL4 and UL2 spaced apart from the second upper edges UE4 and UE2 in the second direction, and second lower separation distances LL4 and LL2 spaced apart from the second lower edges LE4 and LE2 in the second direction. The second upper separation distances UL4 and UL2 may be equal to the second lower separation distances LL4 and LL2, respectively.

The second low-concentration source doping region 306b may be spaced apart, by a second source upper separation distance (i.e., the second upper separation distance UL4), from a second source upper edge (i.e., the second upper edge UE4) located inside the upper side of the isolation region 304 in the second direction. The second low-concentration source doping region 306b may be spaced apart, by a second source lower separation distance (i.e., the second lower separation distance LL4), from a second source lower edge (i.e., the second lower edge LE4) located inside the lower side of the isolation region 304 in the second direction. The second source upper separation distance (i.e., the second upper separation distance UL4) may be equal to the second source lower separation distance (i.e., the second lower separation distance LL4).

The second low-concentration drain doping region 308b may be spaced apart, by a second drain upper separation distance (i.e., the second upper separation distance UL2), from a second drain upper edge (i.e., the second upper edge UE2) located inside the upper side of the isolation region 304 in the second direction. The second low-concentration drain doping region 308b may be spaced apart, by a second drain lower separation distance (i.e., the second lower separation distance LL2), from a second drain lower edge (i.e., the second lower edge LE2) located inside the lower side of the isolation region 304 in the second direction. The second drain upper separation distance (i.e., the second upper separation distance UL2) may be equal to the second drain lower separation distance (i.e., the second lower separation distance LL2).

When the second low-concentration source and drain doping regions 306b and 308b are spaced apart from the isolation region 304 by the second separation distances UL4, LL4, UL2, and LL2, a decrease in a breakdown voltage may be suppressed by suppressing an increase in an electric field at the second edges UE4, LE4, UE2, and LE2 of the isolation region 304 during the operation of the transistor TR1.

In addition, the first separation distances UL3, LL3, UL1, and LL1 from an inner edge of the isolation region 304 of the first low-concentration source and drain doping regions 306a and 308a may be less than the second separation distances UL4, LL4, UL2, and LL2 from an inner edge of the isolation region 304 of the second low-concentration source and drain doping regions 306b and 308b, respectively.

Among the low-concentration source and drain doping regions 306a, 306b, 308a, and 308b, the second low-concentration source and drain doping regions 306b and 308b in the gate-distant region may be respectively spaced apart, by third separation distances SL2 and SL1, from first and second side edges SE2 and SE1 located inside both sides of the isolation region 304 in the first direction. In some embodiments, each of the third separation distances SL2 and SL1 may be several μm. In some embodiments, each of the third separation distances SL2 and SL1 may be about 100 nm to about 500 nm.

The second low-concentration source doping region 306b in the gate-distant region may be spaced apart, by a third source separation distance (i.e., the third separation distance SL2), from the first side edge SE2 located inside one side of the isolation region 304, in the first direction. The second low-concentration drain doping region 308b in the gate-distant region may be spaced apart, by a third drain separation distance (i.e., the third separation distance SL1), from the second side edge SE1 located inside one side of the isolation region 304, in the first direction.

As described above, when the second low-concentration source and drain doping regions 306b and 308b are spaced apart from the isolation region 304 by the third separation distances SL2 and SL1, a decrease in a breakdown voltage may be suppressed by suppressing an increase in an electric field at the first and second side edges SE2 and SE1 of the isolation region 304 during the operation of the transistor TR1.

In the transistor TR1 as described above, an increased current may be promoted and a decrease in breakdown voltage may be suppressed by arranging the low-concentration source and drain doping regions 306a, 306b, 308a, and 308b apart from the isolation region 304 at different separation distances.

Figure 13:
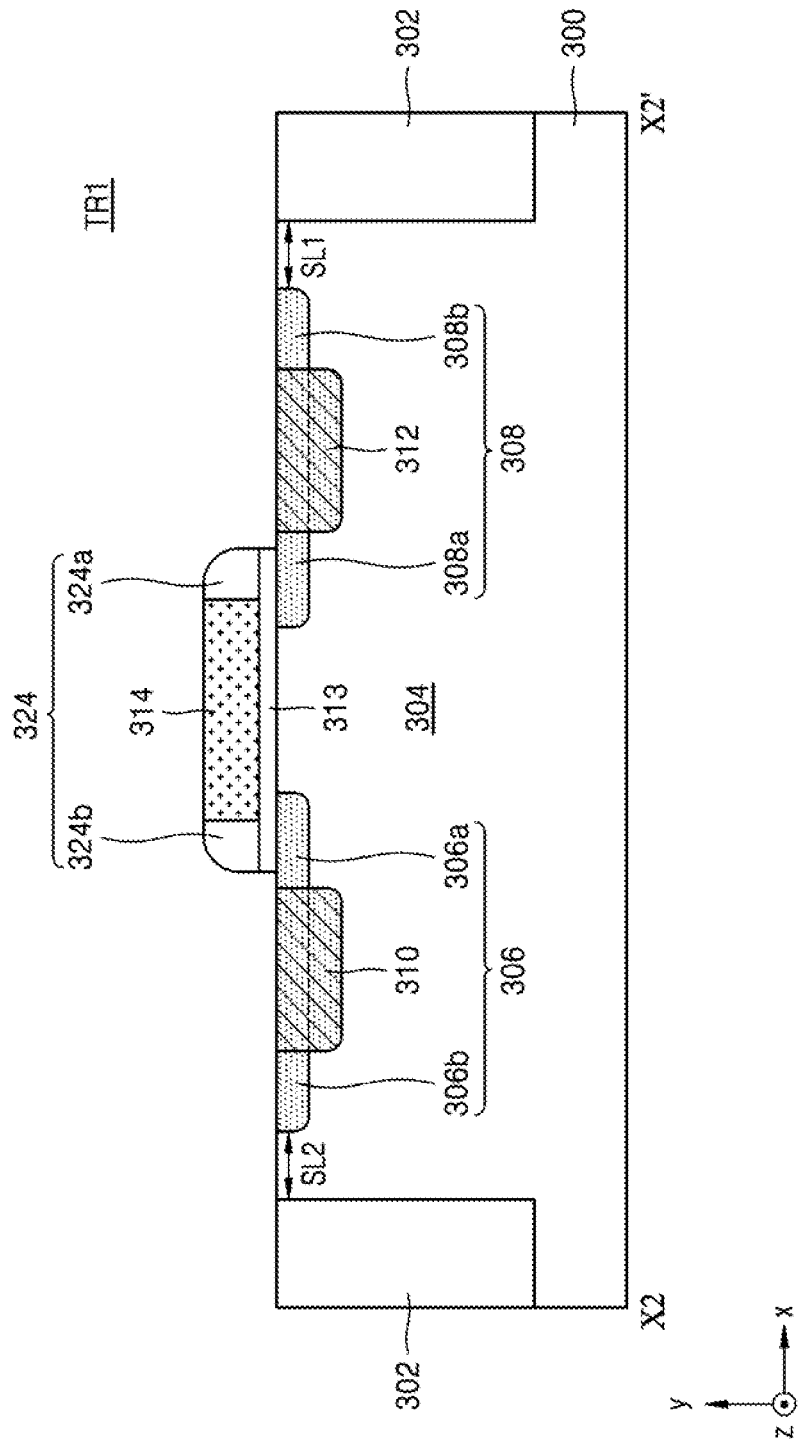
FIG. 13 is an enlarged cross-sectional view taken along line X2-X2' of FIG. 12.
Figure 14:
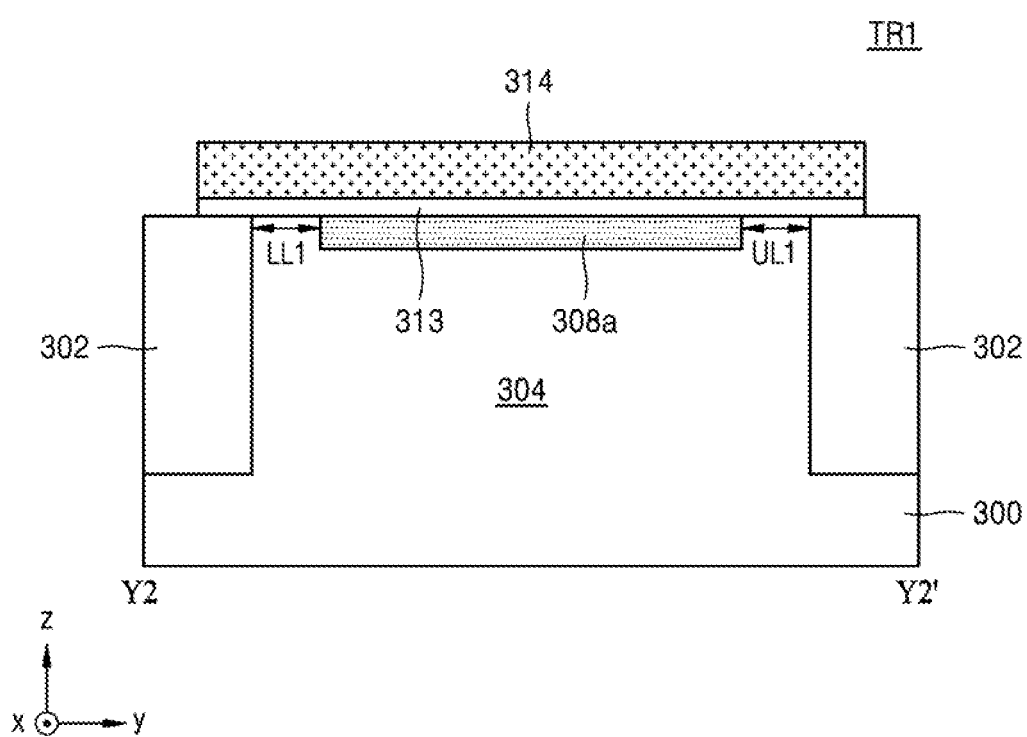
FIG. 14 is an enlarged cross-sectional view taken along line Y2-Y2' of FIG. 12.
Figure 15:
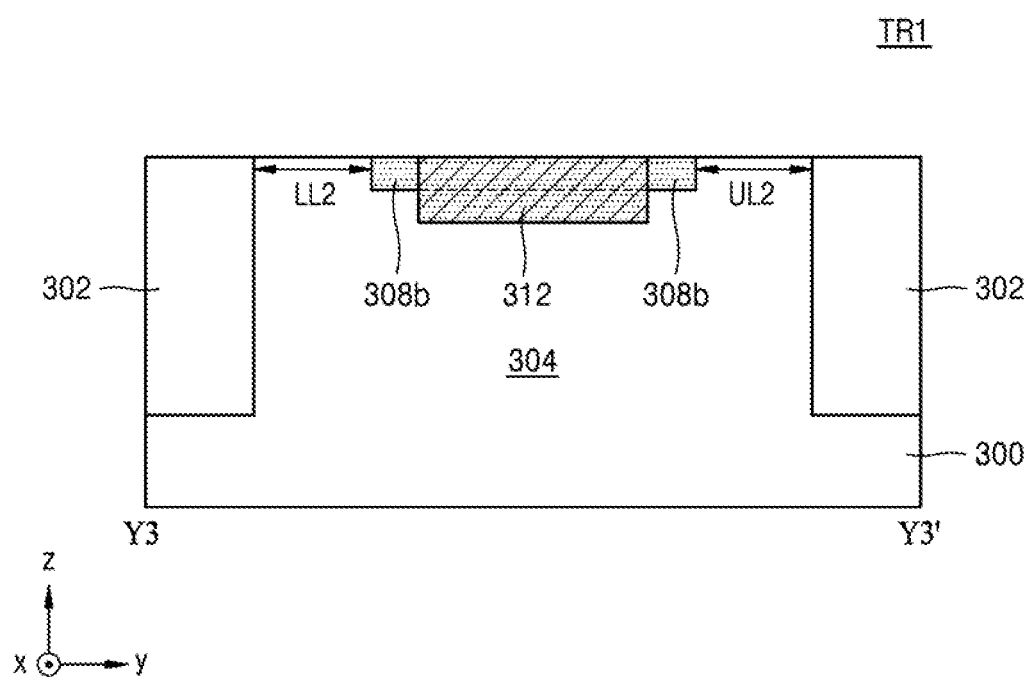
FIG. 15 is an enlarged cross-sectional view taken along line Y3-Y3' of FIG. 12.

FIGS. 13 to 15 are cross-sectional views of the transistor TR1 of FIG. 12. Specifically, FIG. 13 is an enlarged cross-sectional view taken along line X2-X2' of FIG. 12. FIGS. 14 and 15 are enlarged cross-sectional views taken along line Y2-Y2' of FIG. 12 and line Y3-Y3' of FIG. 12, respectively.

As described above, the transistor TR1 may include an isolation region 302, an active region 304, a gate 314, and source and drain regions 306, 310, 308, and 312. The isolation region 302, the active region 304, and the source and drain regions 306, 310, 308, and 312 may be formed in a substrate 300.

The transistor TR1 may include a spacer 324 located on both sides of the gate 314. The spacer 324 may include a first spacer 324a and a second spacer 324b. The substrate 300 may correspond to the lower substrate 52 of FIGS. 7, 8, and 11. In some embodiments, the substrate 300 may be a region doped with first conductivity-type impurities such as p-type impurities. The isolation region 302 may be a trench isolation region.

The active region 304 may be a region or well region doped with first conductivity-type impurities, for example, p-type impurities. The source and drain regions 306, 310, 308, and 312 may be regions doped with second conductivity-type impurities such as n-type impurities which are opposite to those of the active region 304.

As described above, the source and drain regions 306, 310, 308, and 312 may include low-concentration source and drain doping regions 306 and 308 and high-concentration source and drain doping regions 310 and 312.

In some embodiments, the low-concentration source and drain doping regions 306 and 308 may be regions doped with phosphorus or arsenic at a doping concentration of about $5 \times 10^{16}$ per $cm^3$ to about $5 \times 10^{17}$ per $cm^3$. In some embodiments, the high-concentration source and drain doping regions 310 and 312 may be regions doped with phosphorus or arsenic at a doping concentration of about $1 \times 10^{19}$ per $cm^3$ to about $1 \times 10^{20}$ per $cm^3$. The low-concentration source and drain doping regions 306 and 308 may include first low-concentration source and drain doping regions 306a and 308a and second low-concentration source and drain doping regions 306b and 308b.

The low-concentration source and drain doping regions 306 and 308 may be formed in the substrate 300 and substantially aligned with the gate 314. The high-concentration source and drain doping regions 310 and 312 may be formed in the substrate 300 and substantially aligned with the spacer 324. The high-concentration source and drain doping regions 310 and 312 may be located in the low-concentration source and drain doping regions 306 and 308. The high-concentration source and drain doping regions 310 and 312 may have greater doping depths than the low-concentration source and drain doping regions 306 and 308.

As illustrated in FIG. 13, the second low-concentration source and drain doping regions 306b and 308b may be spaced apart, by third separation distances SL2 and SL1, from the inside of both sides of an isolation region 304 in the first direction.

In other words, the second low-concentration source doping region 306b may be spaced apart from the inside of one side of the isolation region 304 in the first direction by a third source separation distance (i.e., the third separation distance SL2). The second low-concentration drain doping region 308b may be spaced apart from the inside of one side of the isolation region 304 in the first direction by a third drain separation distance (i.e., the third separation distance SL1).

As illustrated in FIG. 14, a gate insulating layer 313 may be located under the gate 314. The first low-concentration drain doping region 308a may be spaced apart from the inside of the isolation region 304 in the second direction by the first drain lower separation distance (i.e., the first lower separation distance LL1) and the first drain upper separation distance (i.e., the first upper separation distance UL1). The first drain upper separation distance (i.e., the first upper separation distance UL1) may be equal to the first drain lower separation distance (i.e., the first lower separation distance LL1).

As illustrated in FIG. 15, the second low-concentration drain doping region 308*b* may be spaced apart from the inside of the isolation region 304 in the second direction by the second drain lower separation distance (i.e., the second lower separation distance LL2) and the second drain upper separation distance (i.e., the second upper separation distance UL2). The second drain upper separation distance (i.e., the second upper separation distance UL2) may be equal to the second drain lower separation distance (i.e., the second lower separation distance LL2).

Figure 16:
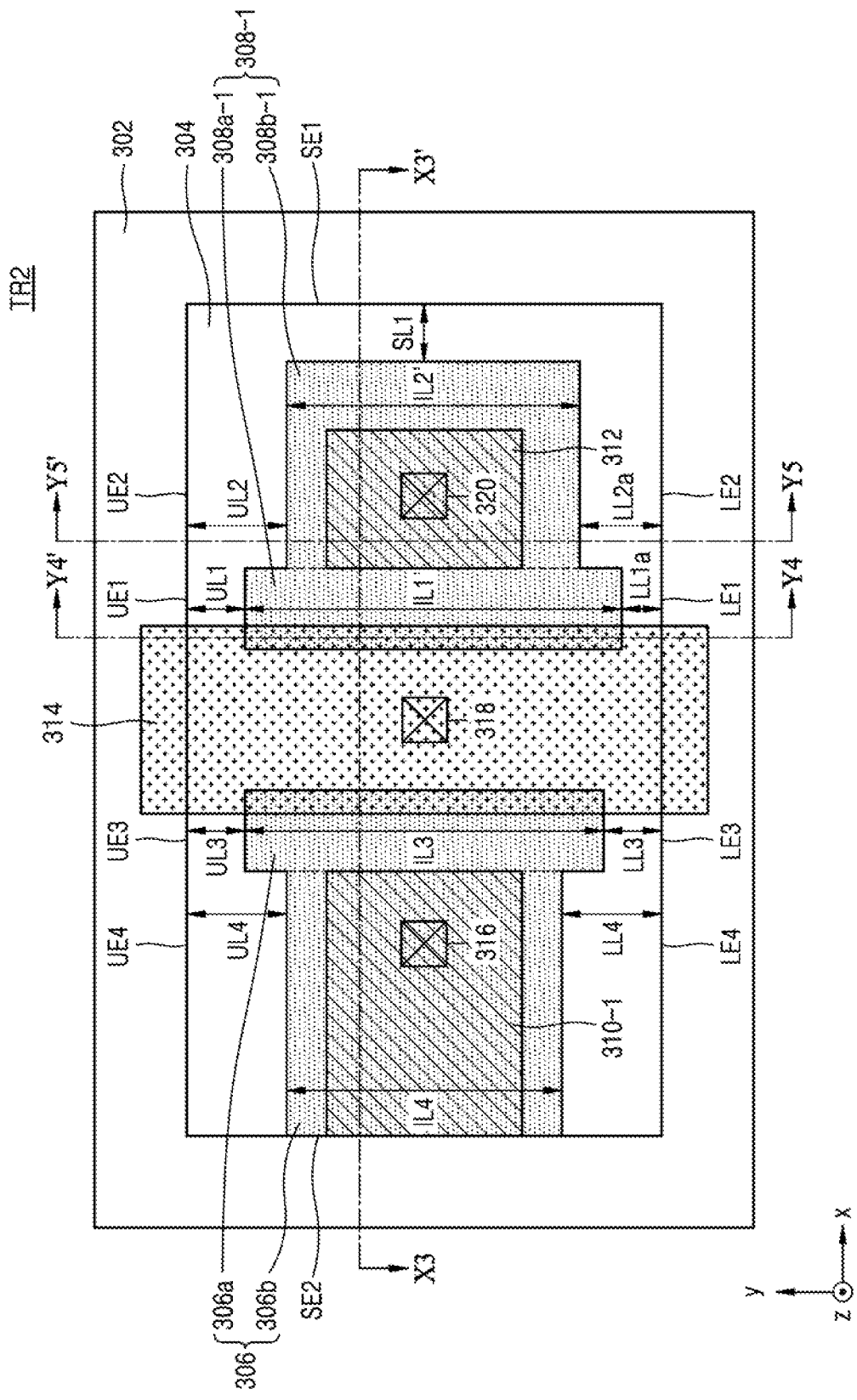
FIG. 16 is a plan view of a transistor included in a semiconductor device according to an embodiment of the inventive concept.

FIG. 16 is a plan view of a transistor TR2 included in a semiconductor device according to an embodiment of the inventive concept.

Specifically, FIG. 16 may be a diagram for describing a transistor TR2 among transistors TR included in the semiconductor device 10, 10-1, 100, 100-1, or 200 described above. FIG. 16 may be a diagram for describing a transistor TR2 among transistors TR included in a peripheral circuit (e.g., the peripheral circuit 30 of FIG. 1) in the peripheral circuit structure PCS of the semiconductor device 10, 10-1, 100, 100-1, or 200 described above. Descriptions of FIG. 16 which are the same as those of FIG. 12 will be briefly given or omitted.

In the transistor TR2, first low-concentration source and drain doping regions 306*a* and 308*a*-1 and second low-concentration source and drain doping regions 306*b* and 308*b*-1 may have an asymmetric structure with respect to a gate 314 in the first direction. In the transistor TR2, a high-concentration source doping region 310-1 and a high-concentration drain doping region 312 may have an asymmetric structure with respect to the gate 314 in the first direction.

The transistor TR2 may be substantially the same as the transistor TR1 of FIG. 12 except that the size of a low-concentration drain doping region 308-1 including the first low-concentration drain doping region 308*a*-1 and the second low-concentration drain doping region 308*b*-1 is different from that in the transistor TR1.

In more detail, a first drain length IL1' of the first low-concentration drain doping region 308*a*-1 of the transistor TR2 in the second direction may be greater than a first drain length (i.e., the first length IL1) of the first low-concentration drain doping region 308*a* of the transistor TR1 in the second direction.

A second drain length IL2' of the second low-concentration drain doping region 308*b*-1 of the transistor TR2 in the second direction may be greater than a second drain length (i.e., the second length IL2) of the second low-concentration drain doping region 308*b* of the transistor TR1 in the second direction.

The transistor TR2 may be substantially the same as the transistor TR1 of FIG. 12 except that a first drain lower separation distance LL1*a*, a second drain lower separation distance LL2*a*, and the arrangement of a high-concentration source doping region 310-1 are different from those in the transistor TR1.

In more detail, the first drain lower separation distance LL1*a* and the second drain lower separation distance LL2*a* of the transistor TR2 may be less than the first drain lower separation distance (i.e., the first lower separation distance LL1) and the second drain lower separation distance (i.e., the second lower separation distance LL2) of the transistor TR1, respectively. In addition, a side surface of the high-concentration source doping region 310-1 of the transistor TR2 may contact a first side edge SE2 of an isolation region 302.

In the transistor TR2 as described above, an increased current may be promoted and a decrease in breakdown voltage may be suppressed by arranging the low-concentration source and drain doping regions 306*a*, 306*b*, 308*a*, and 308*b* apart from the isolation region 304 at different separation distances. In addition, in the transistor TR2, contact resistance may be reduced by varying the arrangement of the high-concentration source and drain doping regions 310-1 and 312.

Figure 17:
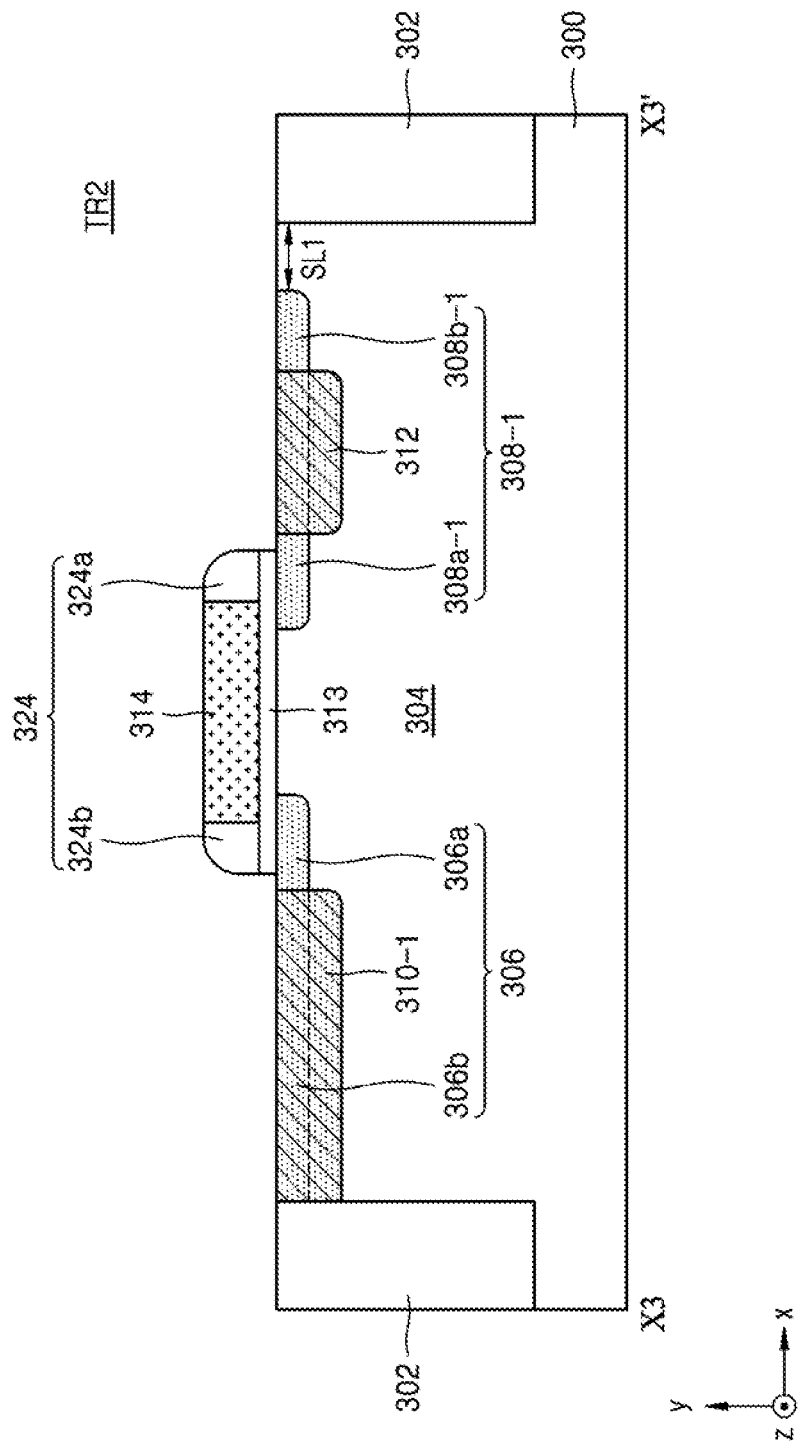
FIG. 17 is an enlarged cross-sectional view taken along line X3-X3' of FIG. 16.
Figure 18:
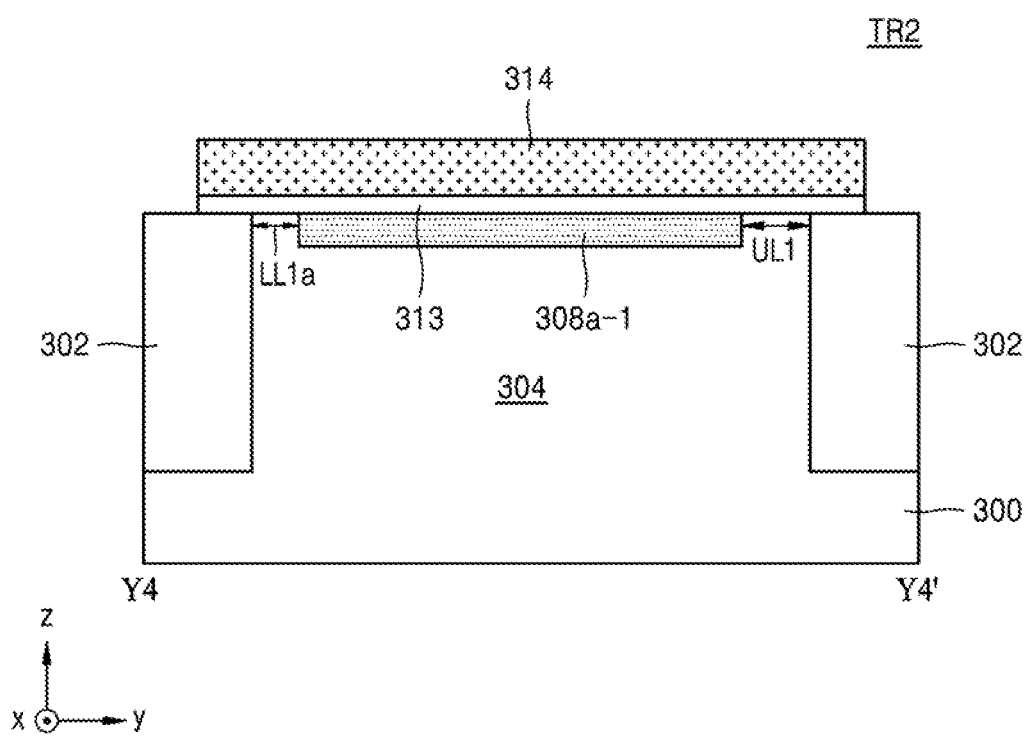
FIG. 18 is an enlarged cross-sectional view taken along line Y4-Y4' of FIG. 16.
Figure 19:
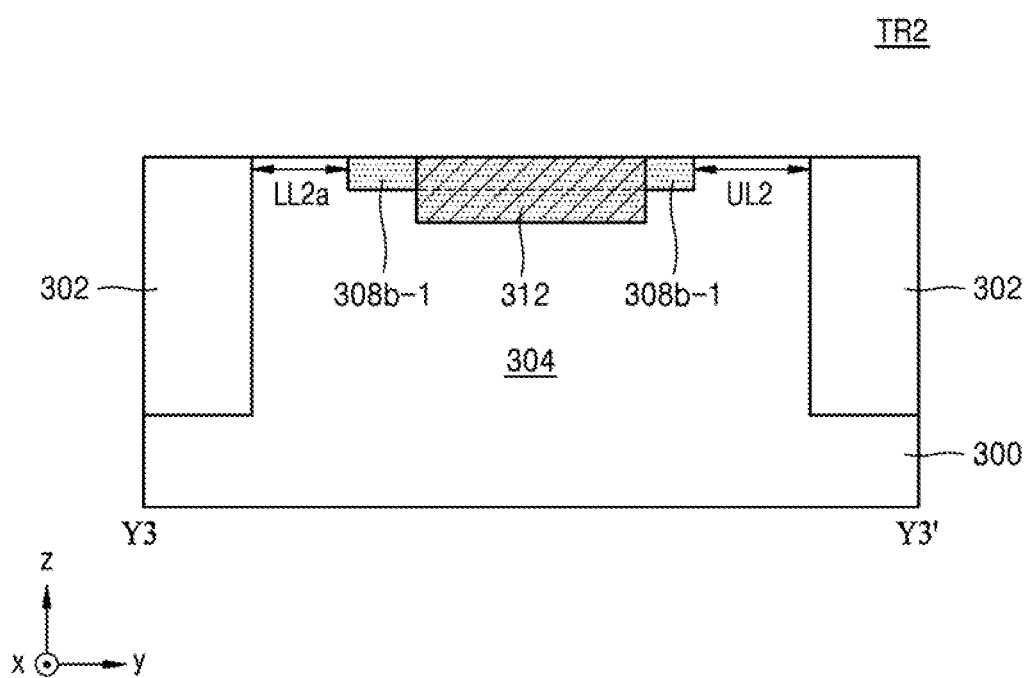
FIG. 19 is an enlarged cross-sectional view taken along line Y5-Y5' of FIG. 16.

FIGS. 17 to 19 are cross-sectional views of the transistor TR2 of FIG. 16.

Specifically, FIG. 17 is an enlarged cross-sectional view taken along line X3-X3' of FIG. 16. FIGS. 18 and 19 are enlarged cross-sectional views taken along line Y4-Y4' and line Y5-Y5' of FIG. 16, respectively.

As described above, the transistor TR2 may include an isolation region 302, an active region 304, a gate 314, and source and drain regions 306, 310-1, 308-1, and 312. The isolation region 302, the active region 304, and the source and drain regions 306, 310-1, 308-1, and 312 may be formed in a substrate 300. The substrate 300 may correspond to the lower substrate 52 of FIGS. 7, 8, and 11. In some embodiments, the substrate 300 may be a region doped with first conductivity-type impurities such as p-type impurities. The isolation region 302 may be a trench isolation region.

The active region 304 may be a region or well region doped with first conductivity-type impurities such as p-type impurities. The source and drain regions 306, 310-1, 308-1, and 312 may be regions doped with second conductivity-type impurities such as n-type impurities which are opposite to those of the active region 304.

As described above, the source and drain regions 306, 310-1, 308-1, and 312 may include low-concentration source and drain doping regions 306 and 308-1 and high-concentration source and drain doping regions 310-1 and 312. The low-concentration source and drain doping regions 306 and 308-1 may include first low-concentration source and drain doping regions 306*a* and 308*a*-1 and second low-concentration source and drain doping regions 306*b* and 308*b*-1.

The high-concentration source and drain doping regions 310-1 and 312 may include a high-concentration source doping region 310-1 and a high-concentration drain doping region 312. The high-concentration source and drain doping regions 310-1 and 312 may be located in the low-concentration source and drain doping regions 306 and 308-1. The high-concentration source and drain doping regions 310-1 and 312 may have greater doping depths than the low-concentration source and drain doping regions 306 and 308-1.

As illustrated in FIG. 17, the high-concentration source doping region 310-1 may contact an inner edge of the isolation region 302, and the second low-concentration drain doping region 308*b*-1 may be spaced apart, by the third drain separation distance (i.e., the third separation distance SL1), from the inside of one side of an isolation region 304 in the first direction.

As illustrated in FIG. 18, a gate insulating layer 313 may be located under the gate 314. The first low-concentration drain doping region 308*a*-1 may be spaced apart from the inside of the isolation region 304 in the second direction by the first drain lower separation distance (i.e., the first lower separation distance LL1*a*) and the first drain upper separation distance (i.e., the first upper separation distance UL1). The first drain upper separation distance (i.e., the first upper separation distance UL1) may be greater than the first drain lower separation distance (i.e., the first lower separation distance LL1a).

As illustrated in FIG. 19, the second low-concentration drain doping region 308b-1 may be spaced apart from the inside of the isolation region 304 in the second direction by the second drain lower separation distance (i.e., the second lower separation distance LL2a) and the second drain upper separation distance (i.e., the second upper separation distance UL2). The second drain upper separation distance (i.e., the second upper separation distance UL2) may be greater than the second drain lower separation distance (i.e., the second lower separation distance LL2a).

Figure 20:
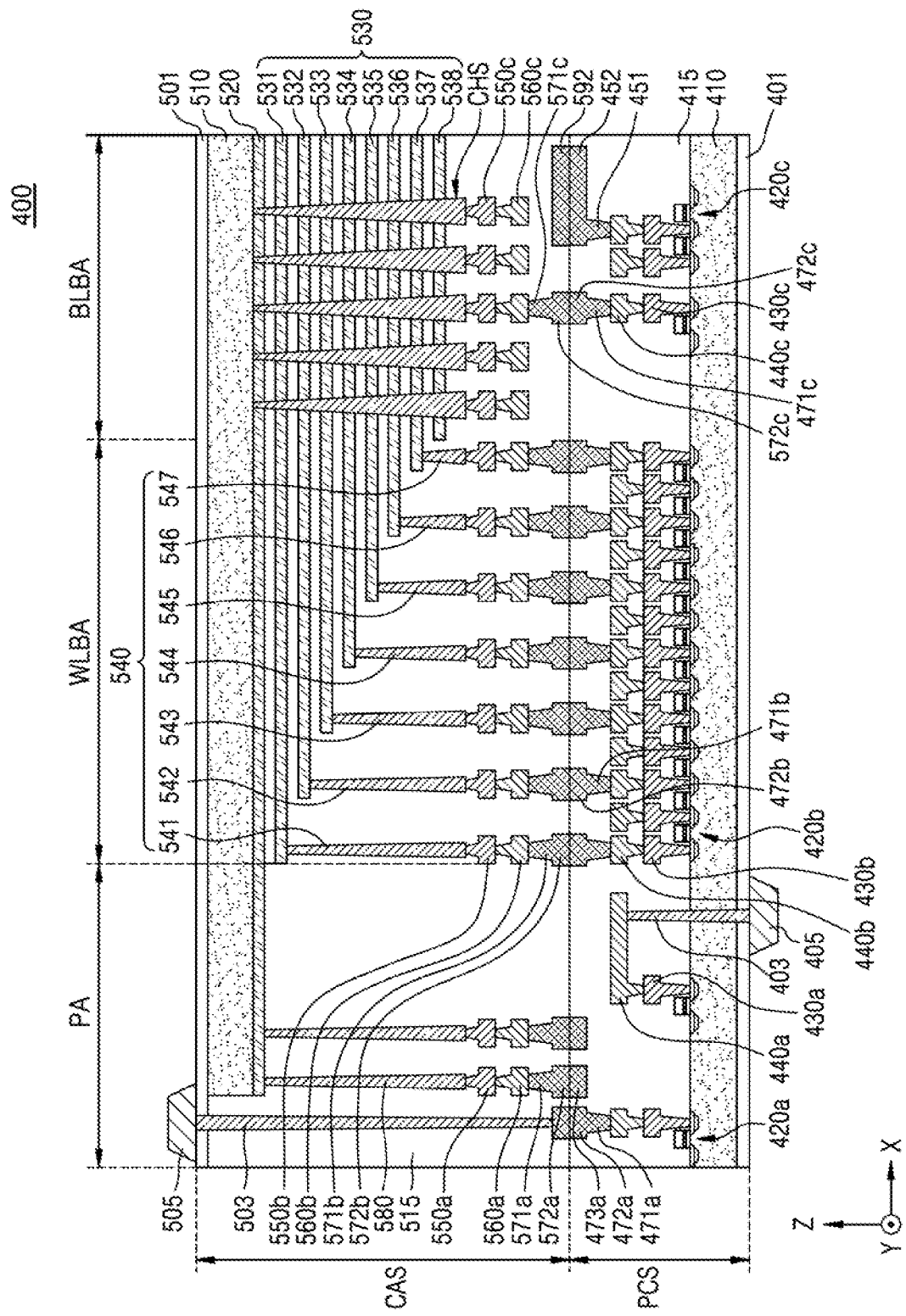
FIG. 20 is a cross-sectional view of a semiconductor device according to an embodiment of the inventive concept.

FIG. 20 is a cross-sectional view of a semiconductor device 400 according to an embodiment of the inventive concept.

Referring to FIG. 20, the semiconductor device 400 may have a chip-to-chip (C2C) structure. The C2C structure may refer to a structure formed by manufacturing an upper chip including a cell array structure CAS on a first wafer, manufacturing a lower chip including a peripheral circuit structure PCS including peripheral circuits on a second wafer separate from the first wafer, and then bonding the upper chip and the lower chip to each other by a bonding method.

The bonding method may refer to a method of electrically connecting a bonding metal formed on an uppermost metal layer of the upper chip and a bonding metal formed on an uppermost metal layer of the lower chip. For example, when the bonding metals include copper (Cu), the bonding method may be a Cu-to-Cu bonding method. The bonding metals may also include aluminum (Al) or tungsten (W)

In FIG. 20, a bonding of one cell array structure CAS on the peripheral circuit structure PCS is illustrated. However, embodiments of the inventive concept are not necessarily limited thereto. For example, upper chips including a plurality of cell array structures may be bonded on the peripheral circuit structure PCS.

Each of the peripheral circuit structure PCS and the cell array structure CAS of the semiconductor device 400 may include an external pad bonding area PA, a word line bonding area WLBA, and a bit line bonding area BLBA.

The peripheral circuit structure PCS may include a first substrate 410, an interlayer insulating layer 415, a plurality of circuit elements 420a, 420b, and 420c formed on the first substrate 410, first metal layers 430a, 430b, and 430c respectively connected to the plurality of circuit elements 420a, 420b, and 420c, and second metal layers 440a, 440b, and 440c formed on the first metal layers 430a, 430b, and 430c.

The circuit elements 420a, 420b, and 420c may include transistors (e.g., the transistors TR1 in FIGS. 12 to 15 and the transistors TR2 in FIGS. 16 to 19) according to embodiments of the inventive concept. In an embodiment, the first metal layers 430a, 430b, and 430c may each include tungsten (having relatively high electrical resistivity), and the second metal layers 440a, 440b, and 440c may each include copper (having relatively low electrical resistivity).

Although only the first metal layers 430a, 430b, and 430c and the second metal layers 440a, 440b, and 440c are shown and described, embodiments of the inventive concept are not necessarily limited thereto, and one or more additional metal layers may be further formed on the second metal layers 440a, 440b, and 440c. At least a portion of the one or more additional metal layers formed on the second metal layers 440a, 440b, and 440c may include aluminum or a like material having a lower electrical resistivity than that of the copper forming the second metal layers 440a, 440b, and 440c.

The interlayer insulating layer 415 may be arranged on the first substrate 410 and at least partially cover the plurality of circuit elements 420a, 420b, and 420c, the first metal layers 430a, 430b, and 430c, and the second metal layers 440a, 440b, and 440c, and may include an insulating material such as silicon oxide or silicon nitride.

Lower bonding metals 471b and 472b may be formed on the second metal layer 440b in the word line bonding area WLBA. In the word line bonding area WLBA, the lower bonding metals 471b and 472b in the peripheral circuit structure PCS may be electrically bonded to upper bonding metals 571b and 572b of the cell array structure CAS. The lower bonding metals 471b and 472b and the upper bonding metals 571b and 572b may include aluminum, copper, tungsten, or the like.

The cell array structure CAS may provide at least one memory block. The cell array structure CAS may include a second substrate 510 and a common source line 520. On the second substrate 510, a plurality of word lines 530 (i.e., 531 to 538) may be stacked in the third direction, which may be perpendicular to an upper surface of the second substrate 510. At least one string select line and at least one ground select line may be arranged on and below the plurality of word lines 530, respectively, and the plurality of word lines 530 may be arranged between the at least one string select line and the at least one ground select line.

In the bit line bonding area BLBA, a channel structure CHS may extend in the third direction, which may be perpendicular to the upper surface of the second substrate 510, and pass through the plurality of word lines 530, the at least one string select line, and the at least one ground select line. The channel structure CHS may include a data storage layer, a channel layer, a buried insulating layer, and the like, and the channel layer may be electrically connected to a first metal layer 550c and a second metal layer 560c. For example, the first metal layer 550c may be a bit line contact and the second metal layer 560c may be a bit line. In an embodiment, the bit line 560c may extend in the second direction, which may be parallel to the upper surface of the second substrate 510.

In an embodiment, an area in which the channel structure CHS, the bit line 560c, and the like are arranged may be defined as the bit line bonding area BLBA. In the peripheral circuit structure PCS of the bit line bonding area BLBA, the bit line 560c may be electrically connected to the circuit elements 420c. For example, the bit line 560c may be connected to upper bonding metals 571c and 572c in the peripheral circuit structure PCS, and the upper bonding metals 571c and 572c may be connected to lower bonding metals 471c and 472c connected to the circuit elements 420c.

In the word line bonding area WLBA, the plurality of word lines 530 may extend in the first direction, which may be parallel to the upper surface of the second substrate 510, and may be connected to a plurality of cell contact plugs 540 (i.e. 541 to 547. The plurality of word lines 530 and the plurality of cell contact plugs 540 may be connected to each other in pads defined by at least a portion of the plurality of word lines 530 extending in different lengths in the first direction. A first metal layer 550b and a second metal layer 560b may be connected to an upper portion of the plurality of cell contact plugs 540 which may be connected to the plurality of word lines 530, sequentially. The plurality of cell contact plugs 540 may be connected to the peripheral circuit structure PCS by the upper bonding metals 571*b* and 572*b* of the cell array structure CAS and the lower bonding metals 471*b* and 472*b* of the peripheral circuit structure PCS in the word line bonding area WLBA. The plurality of cell contact plugs 540 may be electrically connected to the circuit elements 420*b* in the peripheral circuit structure PCS.

A common source line contact plug 580 may be arranged in the external pad bonding area PA. The common source line contact plug 580 may include a conductive material such as a metal, a metal compound, or polysilicon, and may be electrically connected to the common source line 520. A first metal layer 550*a* and a second metal layer 560*a* may be sequentially stacked on an upper portion of the common source line contact plug 580. For example, an area in which the common source line contact plug 580, the first metal layer 550*a*, and the second metal layer 560*a* are arranged may be defined as the external pad bonding area PA.

Lower bonding metals 471*a* and 472*a* may be formed in the external pad bonding area PA. In the external pad bonding area PA, the lower bonding metals 471*a* and 472*a* in the peripheral circuit structure PCS may be electrically bonded to upper bonding metals 571*a* and 572*a* of the cell array structure CAS. The lower bonding metals 471*a* and 472*a* and the upper bonding metals 571*a* and 572*a* may include a metal such as aluminum, copper, tungsten, or the like.

Input-output pads (that is, a first input-output pad 405 and a second input-output pad 505) may be arranged in the external pad bonding area PA. A lower insulating layer 401 at least partially covering a lower surface of the first substrate 410 may be formed below the first substrate 410, and the first input-output pad 405 may be formed on the lower insulating layer 401. The first input-output pad 405 may be connected to at least one of the plurality of circuit elements 420*a*, 420*b*, and 420*c* arranged in the peripheral circuit structure PCS through a first input-output contact plug 403, and may be separated from the first substrate 410 by the lower insulating layer 401. In addition, a side insulating layer may be arranged between the first input-output contact plug 403 and the first substrate 410 to electrically separate the first input-output contact plug 403 and the first substrate 410.

An upper insulating layer 501 covering the upper surface of the second substrate 510 may be formed on the second substrate 510, and the second input-output pad 505 may be arranged on the upper insulating layer 501. The second input-output pad 505 may be connected to at least one of the plurality of circuit elements 420*a*, 420*b*, and 420*c* which may be arranged in the peripheral circuit structure PCS through a second input-output contact plug 503.

In some embodiment, the second substrate 510 and the common source line 520 may be omitted from an area in which the second input-output contact plug 503 is arranged. Also, the second input-output pad 505 might not overlap the word lines 530 in the third direction. The second input-output contact plug 503 may be separated from the second substrate 510 in a direction parallel to the upper surface of the second substrate 510 and may pass through the interlayer insulating layer 515 of the cell array structure CAS to be connected to the second input-output pad 505.

In some embodiments, the first input-output pad 405 and the second input-output pad 505 may be selectively formed. For example, the semiconductor device 400 may include only the first input-output pad 405 arranged on the first substrate 410 or the second input-output pad 505 arranged on the second substrate 510. However, embodiments of the inventive concept are not necessarily limited thereto. For example, the semiconductor device 400 may include both the first input-output pad 405 and the second input-output pad 505.

A metal pattern in an uppermost metal layer may be provided as a dummy pattern, or the uppermost metal layer may be omitted, in each of the external pad bonding area PA and the bit line bonding area BLBA respectively included in the cell array structure CAS and the peripheral circuit structure PCS.

In the external pad bonding area PA of the semiconductor device 400, lower metal patterns 472*a* (i.e. lower bonding metal 472*a*) and 473*a*, which may correspond to an upper metal pattern 572*a* (i.e. upper bonding metal 572*a*) formed in an uppermost metal layer of the cell array structure CAS and have the same shape as the upper metal pattern 572*a* of the cell array structure CAS, may be formed in an uppermost metal layer of the peripheral circuit structure PCS. In the peripheral circuit structure PCS, the lower metal pattern 473*a* which may be formed in the uppermost metal layer of the peripheral circuit structure PCS may not be connected to a contact. Similarly, in the external pad bonding area PA, an upper metal pattern 572*a*, which may correspond to a lower metal pattern 473*a* formed in an uppermost metal layer of the peripheral circuit structure PCS and have the same shape as the lower metal pattern 473*a* of the peripheral circuit structure PCS, may be formed in an uppermost metal layer of the cell array structure CAS.

The lower bonding metals 471*b* and 472*b* may be formed on the second metal layer 440*b* in the word line bonding area WLBA. In the word line bonding area WLBA, the lower bonding metals 471*b* and 472*b* of the peripheral circuit structure PCS may be electrically connected to the upper bonding metals 571*b* and 572*b* of the cell array structure CAS by a bonding method.

Furthermore, in the bit line bonding area BLBA, an upper metal pattern 592, which may correspond to a lower metal pattern 452 formed in the uppermost metal layer of the peripheral circuit structure PCS and have the same shape as the lower metal pattern 452 of the peripheral circuit structure PCS, may be formed in an uppermost metal layer of the cell array structure CAS. A contact may be omitted from the upper metal pattern 592 formed in the uppermost metal layer of the cell array structure CAS. The lower metal pattern 452 in the peripheral circuit structure PCS may be connected to the circuit element 420*c* by the metal layer 451.

Figure 21:
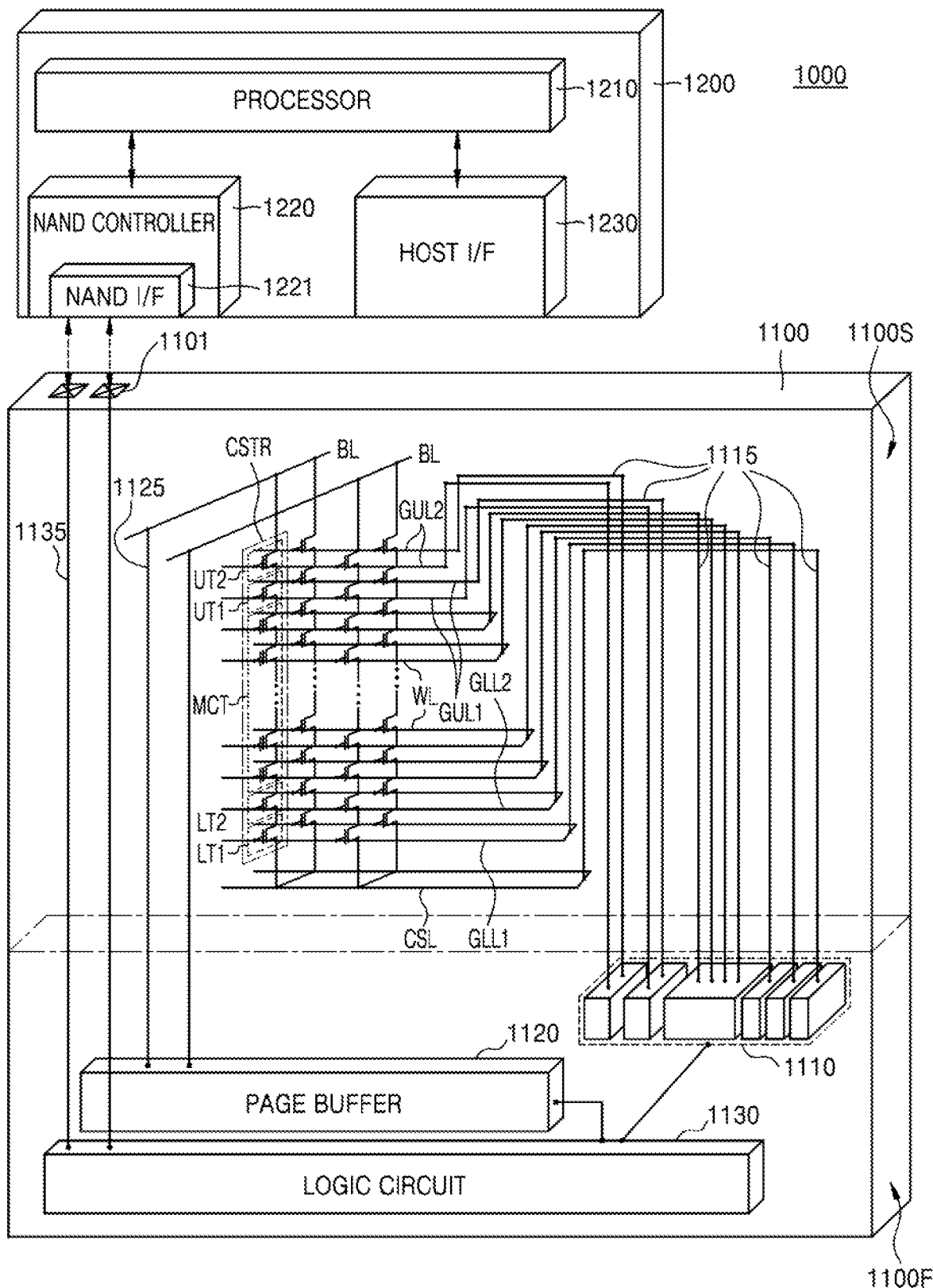
FIG. 21 is a schematic diagram of an electronic system including a semiconductor device according to an embodiment of the inventive concept.

FIG. 21 is a schematic diagram of an electronic system 1000 including a semiconductor device 1100 according to an embodiment of the inventive concept.

Referring to FIG. 21, the electronic system 1000 according to an embodiment of the inventive concept may include a semiconductor device 1100 and a controller 1200 which may be electrically connected to the semiconductor device 1100. The electronic system 1000 may include a storage device including one semiconductor device 1100 or a plurality of semiconductor devices 1100, or an electronic device including the storage device. For example, the electronic system 1000 may include a solid state drive (SSD) device, a universal serial bus (USB), a computing system, a medical device, or a communication device, each of which may include at least one semiconductor device 1100.

The semiconductor device 1100 may include a non-volatile memory device. For example, the semiconductor device 1100 may include a NAND flash memory device including at least one of the structures included in the semiconductor devices 100, 200, 300, 400, 500, 600, 700, 800, and 900 described above. The semiconductor device 1100 may include a first structure 1100F and a second structure 1100S on the first structure 1100F. In some embodiments, the first structure 1100F may be arranged beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines GUL1 and GUL2, first and second gate lower lines GLL1 and GLL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 are not limited to the number illustrated in FIG. 21, and may be variously modified according to embodiments.

In some embodiments, the upper transistors UT1 and UT2 may each include a string select transistor, and the lower transistors LT1 and LT2 may each include a ground select transistor. A plurality of gate lower lines GLL1 and GLL2 may be gate electrodes of the lower transistors LT1 and LT2, respectively. A word line WL may be a gate electrode of a memory cell transistor MCT, and the gate upper lines GUL1 and GUL2 may be gate electrodes of the upper transistors UT1 and UT2, respectively.

The common source line CSL, the plurality of gate upper lines GLL1 and GLL2, the plurality of word lines WL, and the plurality of gate upper lines GUL1 and GUL2 may be electrically connected to the decoder circuit 1110 via a plurality of first connection wiring lines 1115, which may extend from inside the first structure 1100F to the second structure 1100S. A plurality of bit lines BL may be electrically connected to the page buffer 1120 via a plurality of second connection wiring lines 1125, which may extend from inside the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 via an input/output pad 1101 which may be electrically connected to the logic circuit 1130. The input/output pad 1101 may be electrically connected to the logic circuit 1130 via an input/output connection wiring line 1135, which may extend from inside the first structure 1100F to the second structure 1100S.

The controller 1200 may include a processor 1210, a NAND controller 1220, and a host interface 1230. In some embodiments, the electronic system 1000 may include a plurality of semiconductor devices 1100 and the controller 1200 may control the plurality of semiconductor devices 1100.

The processor 1210 may control overall operations of the electronic system 1000 including the controller 1200. The processor 1210 may be operated according to firmware and may access the semiconductor device 1100 by controlling the NAND controller 1220. The NAND controller 1220 may include a NAND interface 1221 that may process communications with the semiconductor device 1100. A control command for controlling the semiconductor device 1100, data intended to be written to the plurality of memory cell transistors MCT of the semiconductor device 1100, data intended to be read from the plurality of memory cell transistors MCT of the semiconductor device 1100, and the like may be transmitted via the NAND interface 1221. The host interface 1230 may provide communications between the electronic system 1000 and an external host. When receiving a control command from the external host via the host interface 1230, the processor 1210 may control the semiconductor device 1100 in response to the control command.

Figure 22:
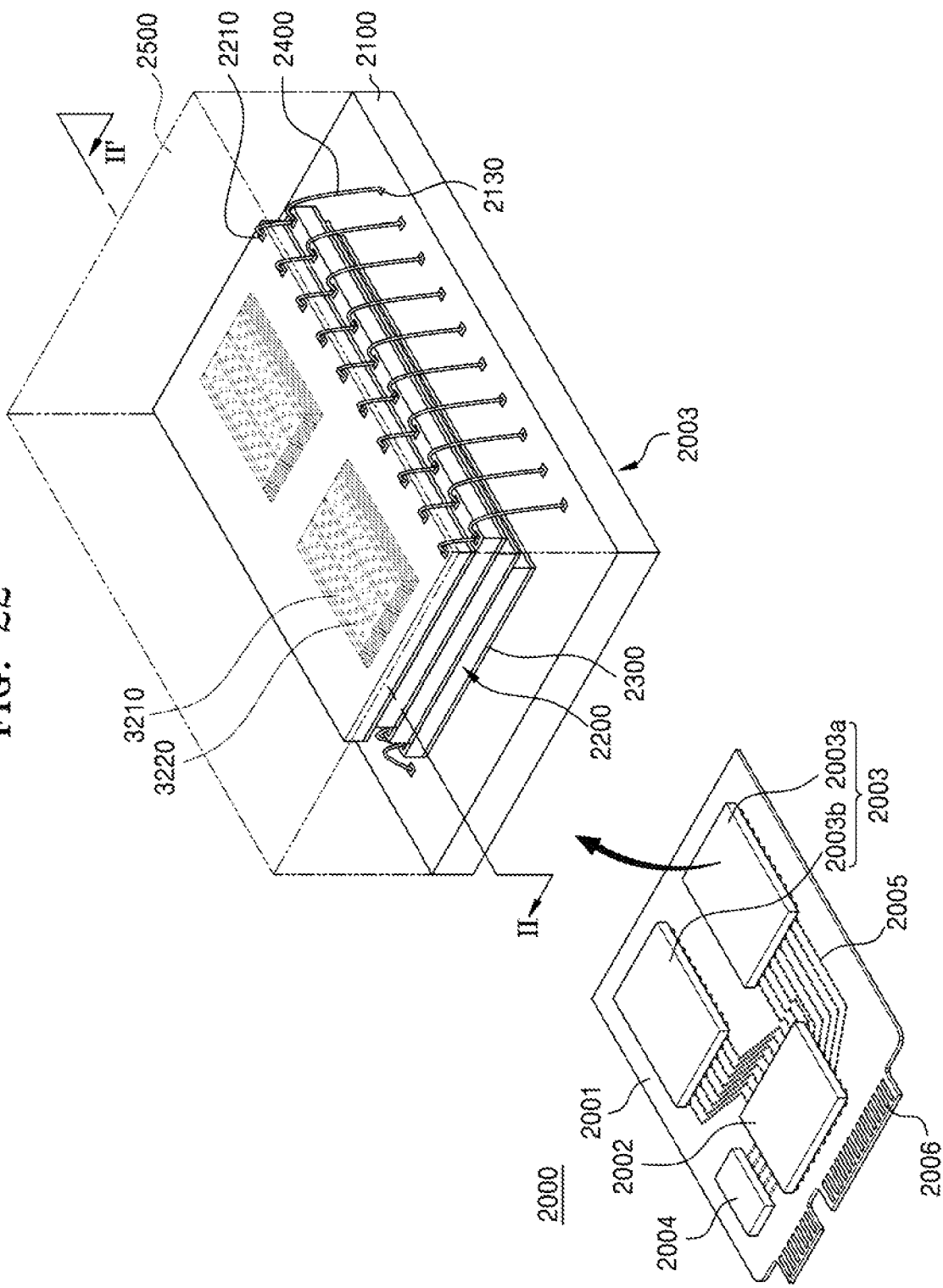
FIG. 22 is a schematic perspective view of an electronic system including a semiconductor package according to an embodiment of the inventive concept.

FIG. 22 is a schematic perspective view of an electronic system 2000 including a semiconductor package according to an embodiment of the inventive concept.

Referring to FIG. 22, the electronic system 2000 according to an embodiment of the inventive concept may include a main substrate 2001, a controller 2002 mounted on the main substrate 2001, one or more semiconductor packages 2003, and DRAM 2004. The semiconductor packages 2003 and the DRAM 2004 may be connected to the controller 2002 by a plurality of wiring patterns 2005 which may be formed on the main substrate 2001.

The main substrate 2001 may include a connector 2006 including a plurality of pins which may be coupled to an external host. The number and arrangement of the plurality of pins in the connector 2006 may vary according to a communication interface between the electronic system 2000 and the external host. In some embodiments, the electronic system 2000 may communicate with the external host according to an interface such as a Universal Serial Bus (USB), a Peripheral Component Interconnect Express (PCI-Express), a Serial Advanced Technology Attachment (SATA), and an M-Phy for Universal Flash Storage (UFS). In some embodiments, the electronic system 2000 may operate via power supplied from the external host via the connector 2006. The electronic system 2000 may further include a power management integrated circuit (PMIC) which may distribute the power supplied from the external host to the controller 2002 and the semiconductor packages 2003.

The controller 2002 may write data to or read data from the semiconductor packages 2003 and may increase an operation speed of the electronic system 2000.

The DRAM 2004 may be a buffer memory for alleviating a speed difference between the external host and the semiconductor packages 2003, which are data storage spaces. The DRAM 2004 included in the electronic system 2000 may also operate as a kind of cache memory and may provide a space for temporarily storing data in a control operation on the semiconductor packages 2003. When the DRAM 2004 is included in the electronic system 2000, the controller 2002 may further include a DRAM controller for controlling the DRAM 2004 and a NAND controller for controlling the semiconductor packages 2003.

The semiconductor packages 2003 may include first and second semiconductor packages 2003a and 2003b, which may be spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 which may be arranged on the package substrate 2100 and at least partially cover the plurality of semiconductor chips 2200 and the connection structure 2400.

The package substrate 2100 may include a printed circuit board including a plurality of package upper pads 2130. Each of the plurality of semiconductor chips 2200 may include an input/output pad 2210. The input/output pad 2210 may correspond to the input/output pad 1101 of FIG. 21. Each of the plurality of semiconductor chips 2200 may include a plurality of gate stacks 3210 and a plurality of channel structures 3220. Each of the plurality of semiconductor chips 2200 may include at least one of the semiconductor devices 100, 100-1, 200, and 400 described above.

In some embodiments, the connection structure 2400 may include a bonding wire electrically connecting the input/output pad 2210 to a package upper pad 2130. Accordingly, in the first and second semiconductor packages 2003a and 2003b, the plurality of semiconductor chips 2200 may be electrically connected to each other by the bonding wire and may be electrically connected to the package upper pads 2130 of the package substrate 2100. In some embodiments, in the first and second semiconductor packages 2003a and 2003b, the plurality of semiconductor chips 2200 may be electrically connected to each other by a connection structure including a through-silicon via (TSV) rather than by the connection structure 2400 of the bonding wire type.

In some embodiments, the controller 2002 and the plurality of semiconductor chips 2200 may be included in one package. In an embodiment, the controller 2002 and the plurality of semiconductor chips 2200 may be mounted on a separate interposer substrate, which is different from the main substrate 2001, and may be connected to each other by wiring lines which may be formed on the interposer substrate.

Figure 23:
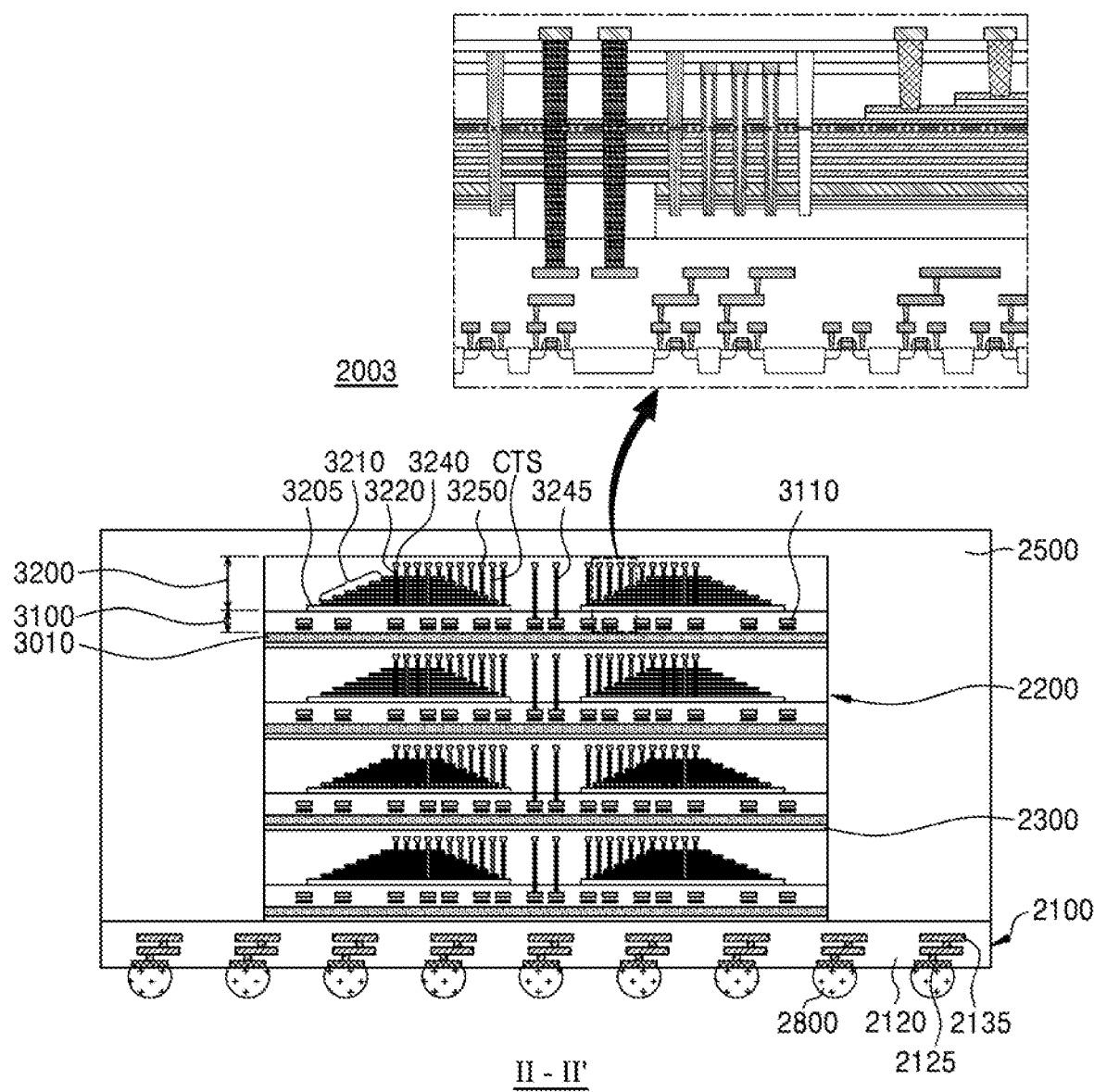
FIG. 23 is a schematic cross-sectional view of a semiconductor package according to an embodiment of the inventive concept.

FIG. 23 is a schematic cross-sectional view of a semiconductor package 2100 according to an embodiment of the inventive concept taken along line II-II' of FIG. 22.

Referring to FIG. 23, in the semiconductor package 2003, a package substrate 2100 may include a printed circuit board. The package substrate 2100 may include a package substrate body 2120, the plurality of package upper pads 2130 (see FIG. 22) arranged on an upper surface of the package substrate body 2120, a plurality of lower pads 2125 arranged on or at least partially exposed by a lower surface of the package substrate body 2120, and a plurality of internal wiring lines 2135 arranged inside the package substrate body 2120 to electrically connect the plurality of package upper pads 2130 to the plurality of lower pads 2125. The plurality of package upper pads 2130 may be electrically connected to a plurality of connection structures 2400. The plurality of lower pads 2125 may be connected to the plurality of wiring patterns 2005 on the main substrate 2001 of the electronic system 2000, which is shown in FIG. 22, via a plurality of conductive connection units 2800.

Each of the plurality of semiconductor chips 2200 may include a semiconductor substrate 3010, a first structure 3100, and a second structure 3200. The first structure 3100 and the second structure 3200 may be sequentially stacked on the semiconductor substrate 3010 in the stated order. The first structure 3100 may include a peripheral circuit area including a plurality of peripheral wiring lines 3110. The second structure 3200 may include a common source line 3205, a gate stack 3210 on the common source line 3205, a channel structure 3220 penetrating the gate stack 3210, and a bit line 3240 electrically connected to the channel structure 3220. The second structure 3200 may include a gate line 3250 which may be electrically connected to the gate stack 3210 via a contact structure CTS. In some embodiments, each of the plurality of semiconductor chips 2200 may include substantially the same configuration as those of the semiconductor devices 100, 100-1, 200, and 400 described above.

Each of the plurality of semiconductor chips 2200 may include a through-wiring line 3245, which may be electrically connected to the plurality of peripheral wiring lines 3110 of the first structure 3100 and may extend into the second structure 3200. The through-wiring line 3245 may be arranged outside the gate stack 3210. In some embodiments, the semiconductor package 2003 may further include a through-wiring line penetrating the gate stack 3210. Each of the plurality of semiconductor chips 2200 may include an input/output pad (2210 of FIG. 22) electrically connected to the plurality of peripheral wiring lines 3110 of the first structure 3100.

While the inventive concept has been particularly shown and described with reference to embodiments thereof, it will be understood that various changes in form and details may be made therein without departing from the spirit and scope of the present disclosure.

What is claimed is:

1. A semiconductor device comprising:
   a substrate;
   a peripheral circuit including a plurality of transistors disposed on the substrate; and
   a memory cell array controlled by the peripheral circuit, wherein each of the plurality of transistors includes:
      an isolation region disposed on the substrate;
      an active region disposed in the isolation region;
      a gate extending in a second direction on the active region; and
      source and drain regions respectively extending in a first direction perpendicular to the second direction in the active region on first and second sides of the gate,
   wherein the source and drain regions include:
      low-concentration source and drain doping regions including first low-concentration source and drain doping regions disposed in a gate-adjacent region adjacent to the gate and second low-concentration source and drain doping regions disposed in a gate-distant region separated from the gate by the gate-adjacent region; and
      high-concentration source and drain doping regions respectively disposed in the low-concentration source and drain doping regions and having higher doping concentrations than the low-concentration source and drain doping regions, and
   wherein a first length in the second direction of the first low-concentration source and drain doping regions is greater than a second length in the second direction of the second low-concentration source and drain doping regions.

2. The semiconductor device of claim 1, wherein the first low-concentration source and drain doping regions are spaced apart by a first separation distance in the second direction from a first edge located inside upper and lower sides of the isolation region in the second direction, and
   the second low-concentration source and drain doping regions are spaced apart by a second separation distance greater than the first separation distance in the second direction from a second edge located inside the upper and lower sides of the isolation region in the second direction.

3. The semiconductor device of claim 2, wherein:
the first edge includes a first upper edge located above the isolation region and a first lower edge located below the isolation region in the second direction;
the first separation distance includes a first upper separation distance spaced apart from the first upper edge in the second direction;
the first separation distance further includes a first lower separation distance spaced apart from the first lower edge in the second direction; and
the first upper separation distance is equal to the first lower separation distance.

4. The semiconductor device of claim 2, wherein:
the second edge includes a second upper edge located above the isolation region and a second lower edge located below the isolation region in the second direction;
the second separation distance includes a second upper separation distance spaced apart from the second upper edge in the second direction;
the second separation distance further includes a second lower separation distance spaced apart from the second lower edge in the second direction; and
the second upper separation distance is equal to the second lower separation distance.

5. The semiconductor device of claim 2, wherein:
the first low-concentration source and drain doping regions include a first low-concentration drain doping region disposed in the gate-adjacent region the first side of the gate;
the first edge includes a first drain upper edge located above the isolation region and a first drain lower edge located below the isolation region in the second direction;
the first separation distance further includes a first drain upper separation distance from the first drain upper edge to the first low-concentration drain doping region in the second direction;
the first separation distance further includes a first drain lower separation distance from the first drain lower edge to the first low-concentration drain doping region in the second direction; and
the first drain upper separation distance is different from the first drain lower separation distance.

6. The semiconductor device of claim 2, wherein:
the second low-concentration source and drain doping regions include a second low-concentration drain doping region disposed in the gate-distant region on the first side of the gate;
the second edge includes a second drain upper edge located above the isolation region and a second drain lower edge located below the isolation region;
the second separation distance further includes a second drain upper separation distance from the second drain upper edge to the second low-concentration drain doping region in the second direction;
the second separation distance further includes second drain lower separation distance from the second drain lower edge to the second low-concentration drain doping region in the second direction; and
the second drain upper separation distance is different from the second drain lower separation distance.

7. The semiconductor device of claim 1, wherein the second low-concentration source and drain doping regions are spaced apart from a side edge located on an inner side of the isolation region in the first direction.

8. The semiconductor device of claim 1, wherein the high-concentration source and drain doping regions are surrounded by the first low-concentration source and drain doping regions and the second low-concentration source and drain doping regions.

9. The semiconductor device of claim 1, wherein:
the second low-concentration source and drain doping regions include a second low-concentration source doping region located in the gate-distant region disposed on the first side of the gate;
the second low-concentration source and drain doping regions further include a second low-concentration drain doping region located in the gate-distant region disposed on the second side of the gate;
the second low-concentration source doping region contacts a second side edge located on an inner side of the isolation region; and
the second low-concentration drain doping region is spaced apart from a first side edge located on an inner side of the isolation region in the first direction.

10. The semiconductor device of claim 1, wherein the high-concentration source and drain doping regions have greater doping depths than the low-concentration source and drain doping regions.

11. A semiconductor device comprising:
a peripheral circuit including a plurality of transistors, wherein each of the plurality of transistors includes:
a gate extending in a second direction on an active region defined by an isolation region; and
source and drain regions respectively extending in a first direction perpendicular to the second direction in the active region on first and second sides of the gate in the first direction,
wherein the source and drain regions include:
low-concentration source and drain doping regions including first low-concentration source and drain doping regions disposed in a gate-adjacent region adjacent to the gate and second low-concentration source and drain doping regions disposed in a gate-distant region separated from the gate by the gate-adjacent region; and
high-concentration source and drain doping regions having higher doping concentrations than the low-concentration source and drain doping regions, and
wherein a first length in the second direction of the first low-concentration source and drain doping regions is greater than a second length in the second direction of the second low-concentration source and drain doping regions.

12. The semiconductor device of claim 11, wherein the first low-concentration source and drain doping regions and the second low-concentration source and drain doping regions on the first side of the gate respectively have a symmetrical structure as the first low-concentration source and drain doping regions and the second low-concentration source and drain doping regions on the second side of the gate.

13. The semiconductor device of claim 11, wherein the first low-concentration source and drain doping regions and the second low-concentration source and drain doping regions on the first side of the gate respectively have an asymmetric structure as the first low-concentration source and drain doping regions and the second low-concentration source and drain doping regions on the second side of the gate.

14. The semiconductor device of claim 11, wherein the high-concentration source and drain doping regions are surrounded by the first low-concentration source and drain doping regions and the second low-concentration source and drain doping regions.

15. The semiconductor device of claim 11, wherein the first low-concentration source and drain doping regions are spaced apart by a first separation distance in the second direction from a first edge located inside upper and lower sides of the isolation region, and
the second low-concentration source and drain doping regions are spaced apart by a second separation distance greater than the first separation distance in the second direction from a second edge located inside the upper and lower sides of the isolation region.

16. The semiconductor device of claim 11, wherein the second low-concentration source and drain doping regions are spaced apart from a side edge inside a side surface of the isolation region in the first direction.

17. The semiconductor device of claim 11, wherein:
the second low-concentration source and drain doping regions include a second low-concentration source doping region disposed in the gate-distant region on one side of the gate,
the second low-concentration source and drain doping regions further include a second low-concentration drain doping region located in the gate-distant region on another side of the gate;
the second low-concentration source doping region contacts a second side edge located on an inner side of the isolation region; and
the second low-concentration drain doping region is spaced apart from a first side edge located on an inner side of the isolation region in the first direction.

18. The semiconductor device of claim 11, wherein the high-concentration source and drain doping regions have greater doping depths than the low-concentration source and drain doping regions.

19. An electronic system comprising:
a main substrate;
a semiconductor device disposed on the main substrate; and
a controller electrically connected to the semiconductor device,
wherein the semiconductor device includes a peripheral circuit including a plurality of transistors,
wherein each of the plurality of transistors includes:
a gate extending in a second direction on an active region defined by an isolation region; and
source and drain regions respectively extending in a first direction perpendicular to the second direction in the active region on first and second sides of the gate,
wherein the source and drain regions include:
low-concentration source and drain doping regions including first low-concentration source and drain doping regions disposed in a gate-adjacent region adjacent to the gate and second low-concentration source and drain doping regions disposed in a gate-distant region separated from the gate by the gate-adjacent region; and
high-concentration source and drain doping regions having higher doping concentrations than the low-concentration source and drain doping regions, and
wherein a first length in the second direction of the first low-concentration source and drain doping regions is greater than a second length in the second direction of the second low-concentration source and drain doping regions.

20. The electronic system of claim 19, wherein the first low-concentration source and drain doping regions are spaced apart by a first separation distance in the second direction from a first edge inside the isolation region, and
the second low-concentration source and drain doping regions are spaced apart by a second separation distance greater than the first separation distance in the second direction from a second edge inside the isolation region.

* * * * *